US006736291B1

(12) United States Patent
Mimura et al.

(10) Patent No.: US 6,736,291 B1
(45) Date of Patent: May 18, 2004

(54) VISCOUS MATERIAL APPLICATION APPARATUS

(75) Inventors: Toshinori Mimura, Sakai (JP); Hiroshi Yamauchi, Katano (JP); Wataru Hirai, Osaka (JP); Hiroaki Onishi, Yamanashi (JP); Koichi Nagai, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/926,588

(22) PCT Filed: Mar. 13, 2000

(86) PCT No.: PCT/JP00/01513
§ 371 (c)(1),
(2), (4) Date: Nov. 21, 2001

(87) PCT Pub. No.: WO00/71264
PCT Pub. Date: Nov. 30, 2000

(30) Foreign Application Priority Data

May 21, 1999 (JP) ............................................. 11-141069

(51) Int. Cl.⁷ ................................................. B67D 5/56
(52) U.S. Cl. ....................... 222/129; 222/132; 222/135; 222/145.5; 222/263; 222/389
(58) Field of Search ................................. 222/129, 108, 222/135, 136, 145.5, 185.1, 263, 277, 389; 427/421

(56) References Cited

U.S. PATENT DOCUMENTS 4,622,239 A    11/1986  Schoenthaler et al.
4,674,658 A *   6/1987  Van Brocklin .............. 222/135
4,938,994 A     7/1990  Choinski
5,088,631 A *   2/1992  Torterotot ................... 222/389
5,186,982 A     2/1993  Blette et al.
5,529,212 A *   6/1996  Terhardt ....................... 222/1
5,799,833 A *   9/1998  Green et al. ................ 222/135
5,881,914 A *   3/1999  Tsuda et al. .................. 222/54
5,927,560 A *   7/1999  Lewis et al. ................ 222/263

FOREIGN PATENT DOCUMENTS

JP    63-77668     5/1988
JP    6-170304     6/1994
JP    9-164357     6/1997

OTHER PUBLICATIONS

English Language Abstract of JP–9–164357.
English Language Abstract of JP–6–170304.
English Language Abstract of JP63–77668.

* cited by examiner

Primary Examiner—Gene Mancene
Assistant Examiner—Frederick Nicolas
(74) Attorney, Agent, or Firm—Greenblum & Bernstein, P.L.C.

(57) ABSTRACT

A viscous material application apparatus includes a main body having a pressurized chamber which connects through to a discharge port and stores a viscous material, a viscous material supply device for transferring the viscous material to the pressurized chamber, and a discharge pressure regulating device for regulating the discharge pressure of the viscous material when the viscous material inside the pressurized chamber is pressurized and discharged by increasing or decreasing the capacity of the pressurized chamber, the discharge pressure regulating device being provided either inside the pressurized chamber or facing the pressurized chamber.

10 Claims, 32 Drawing Sheets

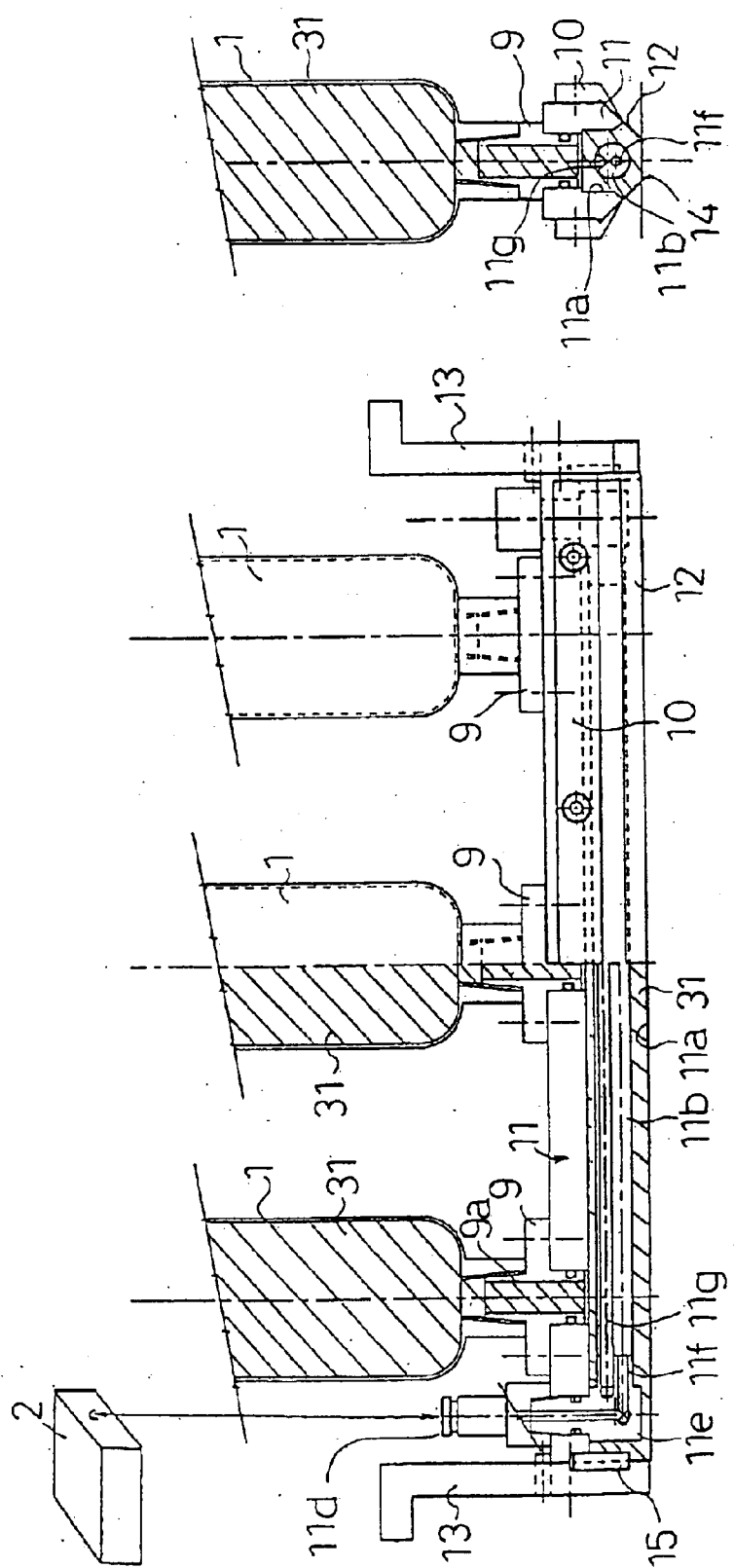

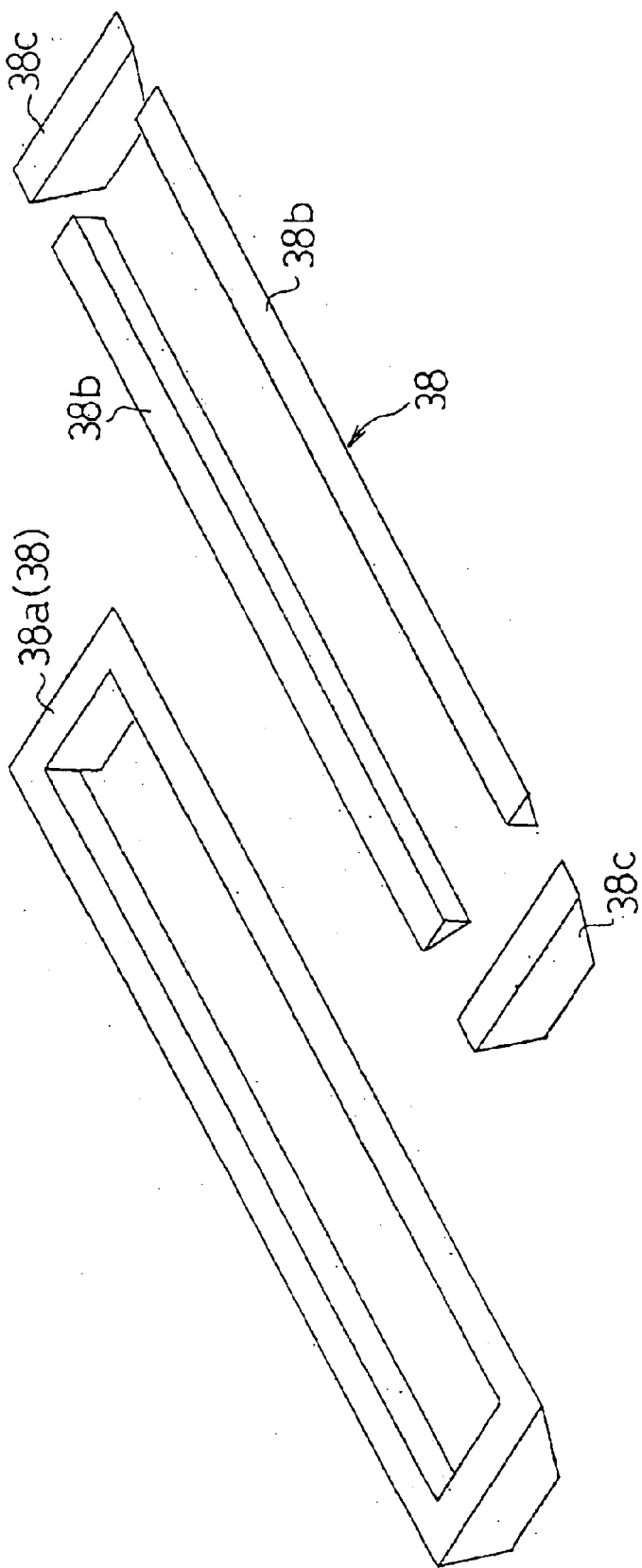

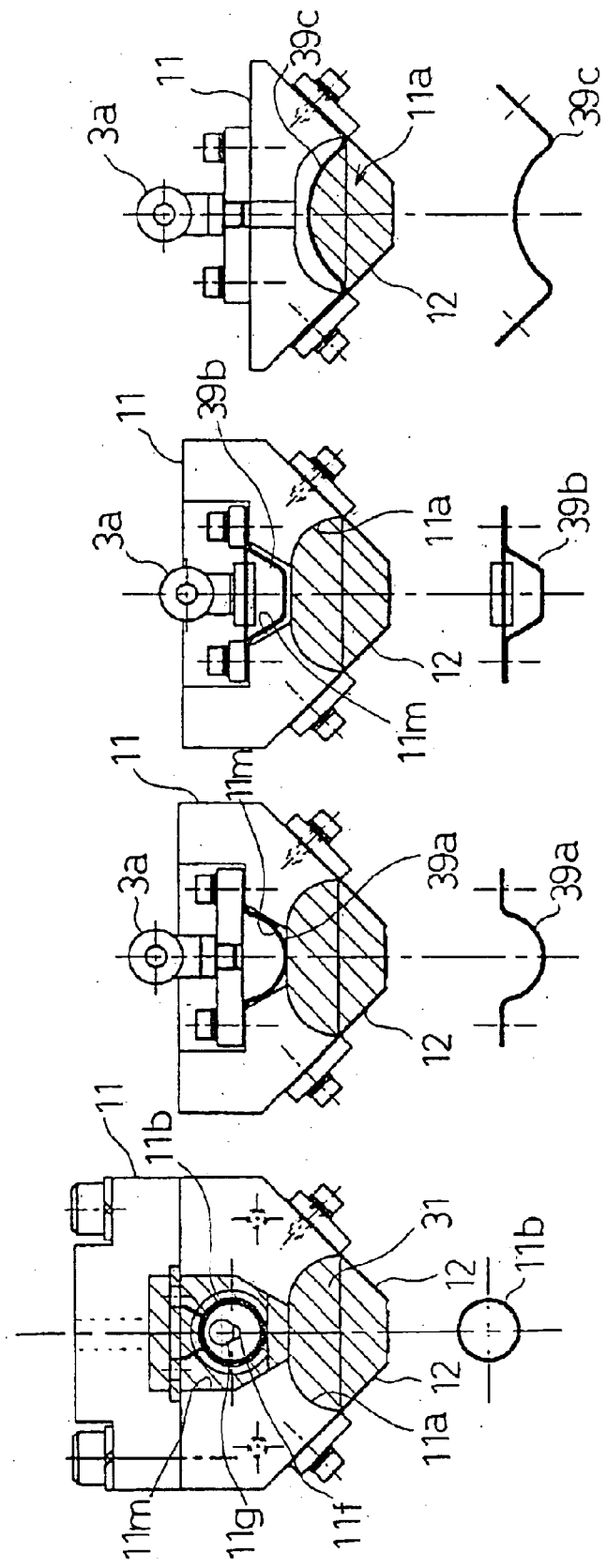

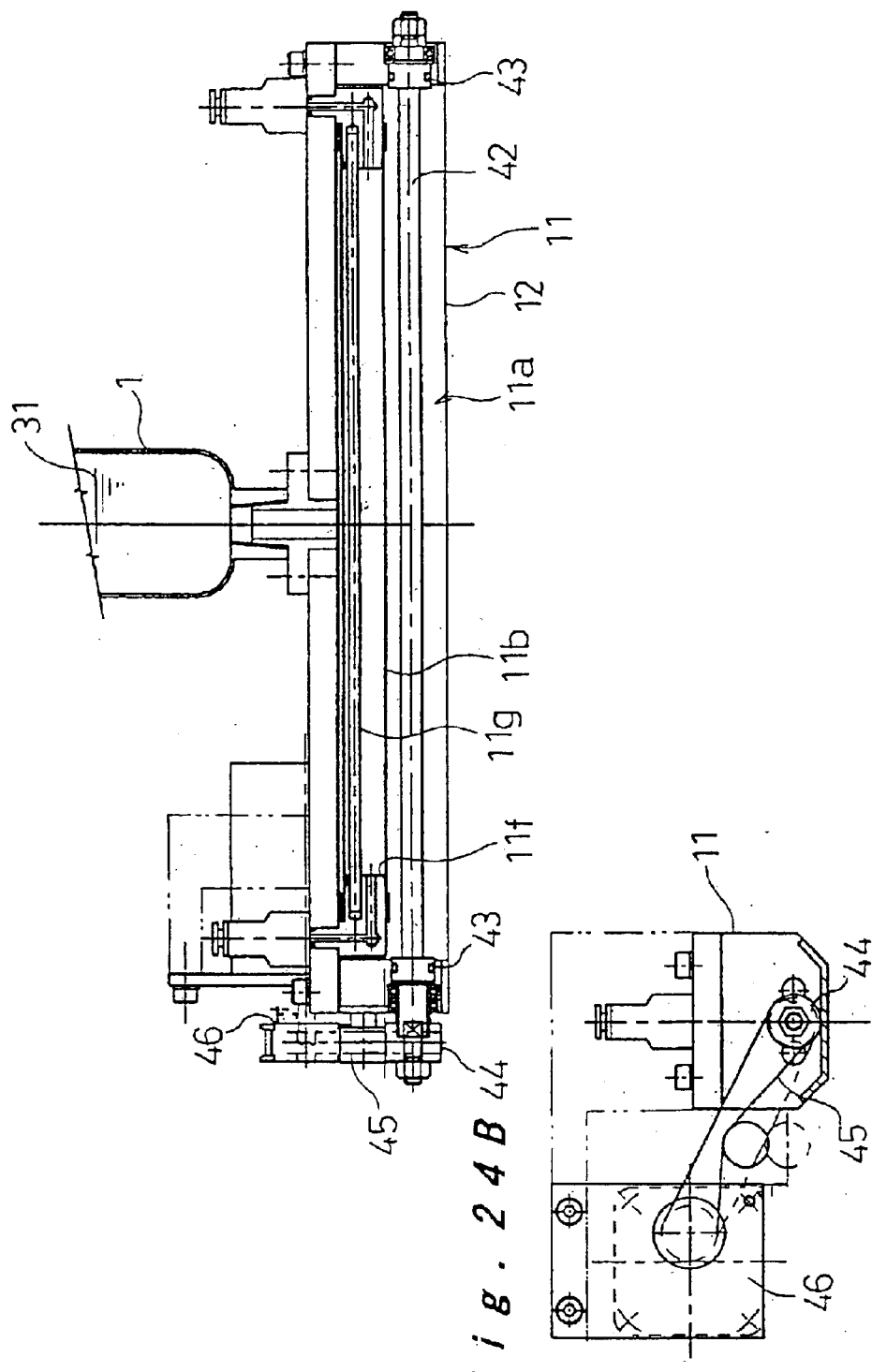

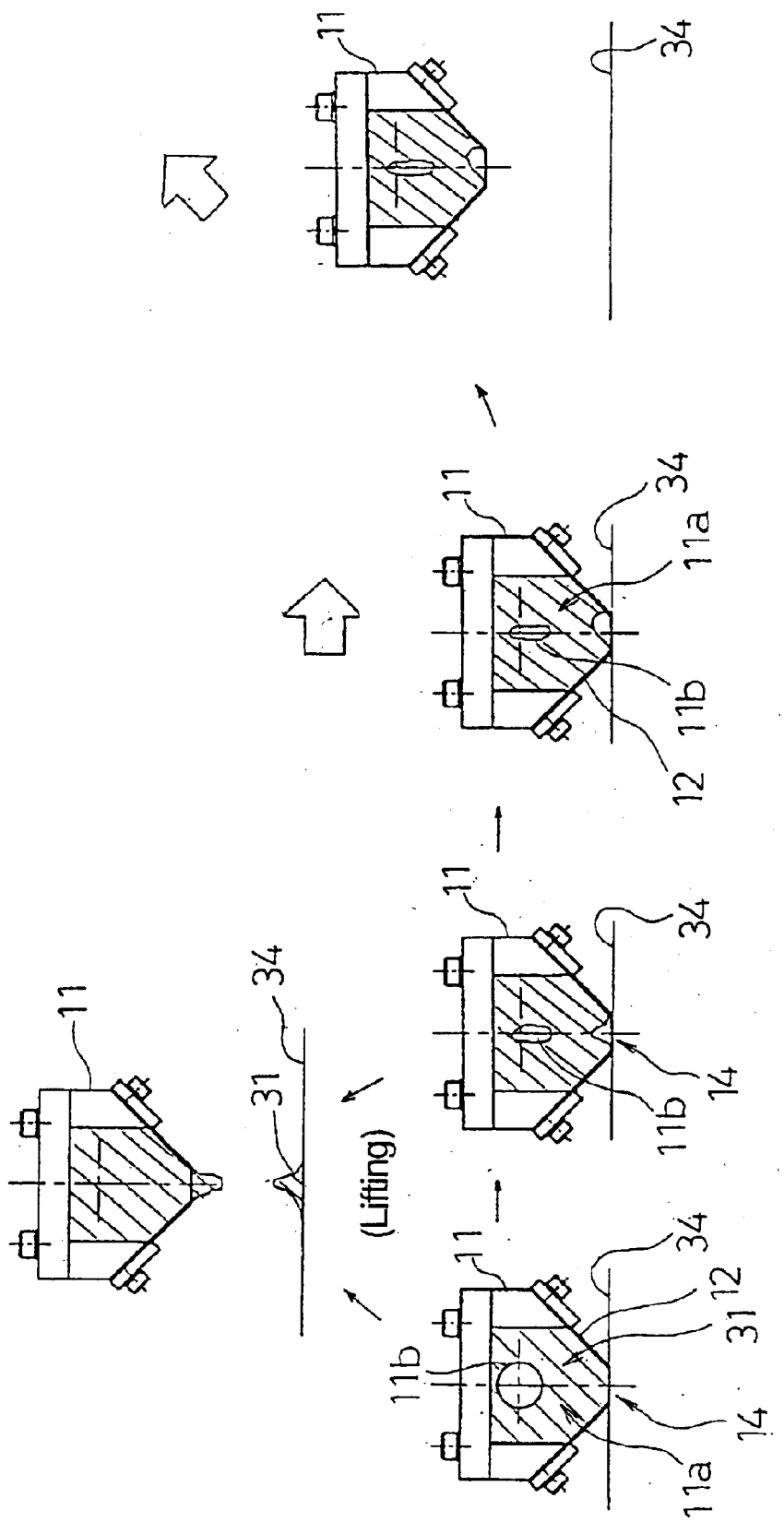

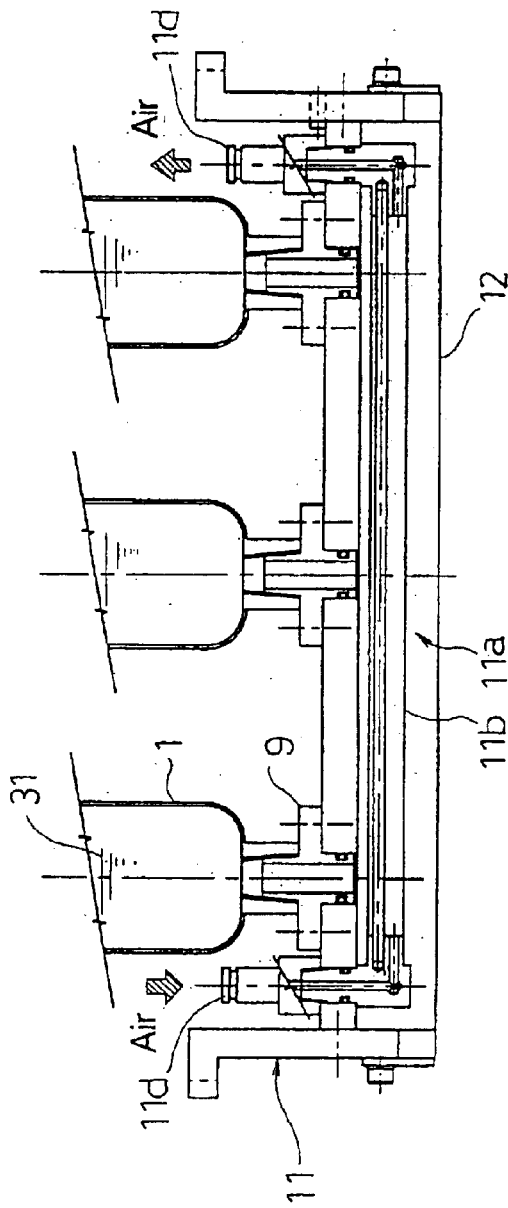
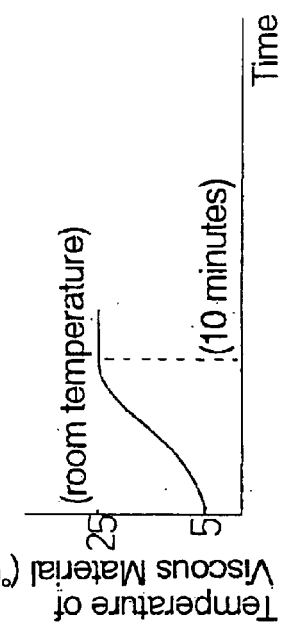
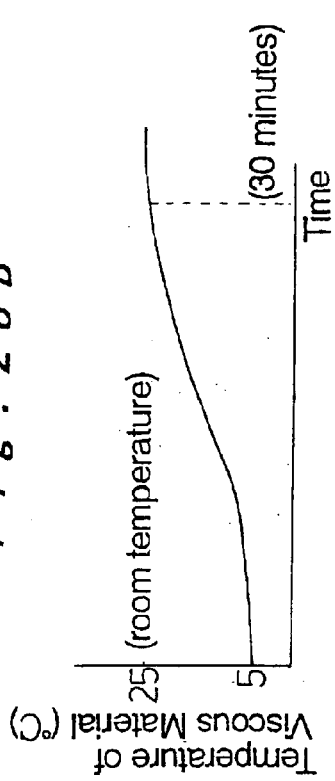

VISCOUS MATERIAL APPLICATION APPARATUS

TECHNICAL FIELD

The present invention relates to a viscous material application apparatus for applying a viscous material such as an adhesive, cream solder or a conductive paste to an application target such as a circuit board.

BACKGROUND ART

The basic configuration of a conventional viscous material application apparatus is described with reference to the schematic illustrations of FIG. 29A and FIG. 29B. As shown in FIG. 29A, this viscous material application apparatus comprises a material supply section 1 for holding a viscous material 5 such as an adhesive or cream solder, and a pressure regulating section 22 for regulating and supplying compressed air to the material supply section 1, and the viscous material 5 is pressurized by the compressed air, and discharged from a discharge port 4a of a discharge section 4.

Furthermore as shown in FIG. 29B, in some cases a valve 16 for starting and stopping the supply of compressed air may also be provided between the material supply section 1 and the discharge section 4. In this apparatus, in the case where a predetermined quantity of the viscous material 5 is required to be discharged, the viscous material 5 is pressurized from above by compressed air supplied from the pressure regulating section 22 and forced downward, and the valve 16 is then opened and the viscous material 5 is discharged from the discharge port 4a. Then, when application onto the circuit board has been completed, the valve 16 is closed.

However, in a viscous material application apparatus of the conventional configuration described above, because the compressed air supplied from the pressure regulating section 22 is applied on top of the viscous material 5 contained in the material supply section 1, then depending on the characteristics of the viscous material 5, the pressure of the compressed air may be affected by the viscosity resistance of the viscous material 5 and find it difficult to reach the vicinity of the distant discharge port 4a of the discharge section 4. Consequently, variations developed in the pressure transmission, and it was difficult to obtain highly accurate discharge quantities and discharge pressures.

Furthermore as shown in FIG. 30, the response time from the point where a signal is output to start discharge at a predetermined pressure, to the point where discharge at that pressure is actually started, also lengthens for the same reasons, and so a waiting period develops from transmission of a discharge start signal to the actual start of discharge. In addition, after stopping pressurization residual pressure remains, and so other problems arise such as the viscous material 5 hanging down from the discharge port 4a being forced out near the discharge port 4a and adhering to the circuit board, creating a bridge, when the viscous material application apparatus is next positioned on the circuit board.

Furthermore in the aforementioned conventional apparatus, in those cases where a device called a multiple nozzle 4c with a plurality of discharge ports 4d, such as that shown in FIG. 31A and FIG. 31B, was used for performing a two dimensional bulk supply of the viscous material, the following problems also arose. In highly viscous materials, the pressure transmission through to the viscous material 5 does not occur uniformly, and when a conductive paste 31 was applied to a circuit board 32, then as shown in FIG. 32A and FIG. 32B, because the transmitted pressure from the compressed air differed depending on the position of the discharge port 4d, a variation developed in the discharge quantity depending on the discharge position.

The present invention aims to resolve the above problems, with an object of providing a viscous material application apparatus capable of improving discharge accuracy and increasing efficiency by carrying out the pressure transmission for discharging the viscous material efficiently, and improving the responsiveness.

DISCLOSURE OF THE INVENTION

In order to achieve the above object, a viscous material application apparatus of the present invention comprises: a main body having a pressurized chamber which connects through to a discharge port and stores a viscous material; and a viscous material supply device for transferring the viscous material under pressure to the pressurized chamber, wherein a discharge pressure regulating device for regulating the discharge pressure of the viscous material by increasing or decreasing the capacity of the pressurized chamber when the viscous material inside the pressurized chamber is pressurized and discharged is provided either inside the pressurized chamber or facing the pressurized chamber.

According to the present invention, because the viscous material stored in the pressurized chamber is discharged with a discharge pressure regulated by the discharge pressure regulating device provided either inside the pressurized chamber or facing the pressurized chamber, the air pressure is transmitted efficiently and uniformly to the viscous material, and so the responsiveness from the start of pressurization to the start of discharge improves, and a suitable discharge quantity of the viscous material is discharged almost instantaneously. Then, following completion of the discharge, because no residual pressure remains within the pressurized chamber, the problem seen in conventional apparatus, where the viscous material hangs down from the discharge port and then adheres to the application target during the next application, is prevented. Because the effects of viscosity resistance are minimal even with highly viscous materials, improved discharge accuracy and increased efficiency are achieved across all types of viscous material application, enabling for example, a uniform discharge even in the case of screen printing where a printing paste is applied along a straight line.

The discharge pressure regulating device may suitably comprise a pouch positioned inside the pressurized chamber for increasing or decreasing internal capacity thereof through the intake or exhausting of gas, and an air supply section for regulating the pressure inside the pouch by either supplying gas to, or discharging gas from the pouch, and as the shape of the pouch transforms with the intake or exhausting of gas from the air supply section and the pressurized chamber, the capacity of the pressurized chamber is increased or decreased, enabling the discharge pressure to be easily adjusted. In this case, the closer the air pouch is positioned to the discharge port inside the pressurized chamber, the smaller the difference will be between the air pressure used for discharge and the actual discharge pressure, and the more the responsiveness is improved.

The discharge pressure regulating device may also be constructed from an actuator such as an air cylinder and a voice coil motor, and a diaphragm which transforms under the influence of the actuator and increases or decreases the capacity inside the pressurized chamber.

Furthermore, it is desirable to employ a configuration in which a pressurized chamber, a discharge pressure regulating device and a discharge port are shared across a plurality of linearly aligned viscous material supply devices, with the discharge pressure of the viscous material at discharge positions along the alignment direction of the viscous material supply devices being regulated in a single batch. According to this configuration, in screen printing such as that described above, the discharge of a highly viscous printing paste is carried out uniformly and with a high degree of accuracy, regardless of the discharge position.

Another suitable configuration uses a plurality of discharge pressure regulating devices, with the discharge pressure of the viscous material at a discharge position being regulated as desired, and this configuration enables localized pressure regulation to be performed with ease.

Furthermore, by attaching a pair of inclined plates which approach one another in a downward direction to both sides of the lower section of the pressurized chamber, and using the opening between the bottom edges of these plates as a discharge port, these inclined plates function as a substitute for a squeegee in the aforementioned screen printing, and enable the filling of a screen opening with printing paste to be appropriately performed by discharge pressure regulation, and so highly accurate printing is possible, and an improvement in printing quality is achieved.

According to a configuration not restricted to supply by pressure transfer using the viscous material supply device used for transferring the viscous material under pressure in the aforementioned configuration, by forming the main body to allow for easy exchange, and enabling a cartridge filled with a viscous material to be accommodated within the main body, the viscous material is stored in the pressurized chamber, the pressurizing device for supplying the viscous material becomes unnecessary, and supply of the viscous material is simplified.

Furthermore in another suitable configuration, a soft elastic material is inserted between the aforementioned inclined plates and the lower side surfaces of the pressurized chamber. In such a configuration, when the inclined plates are pressed onto the screen, the inclined plates flex causing an improvement in the adhesion with the screen. Accordingly, the problem of the viscous material seeping out between the inclined plates and the screen when the viscous material is supplied into the pressurized chamber or when the viscous material inside the pressurized chamber is pressurized is prevented. However, in order to further improve the adhesion, the inclined plates need to be lengthened to increase their flexion. Such lengthening causes the capacity of the pressurized chamber to increase and the amount of supplied viscous material to increase, which leads to an increase in the supply time and an increase in the weight of the application unit. By inserting a soft elastic material between the inclined plates and the lower side surfaces of the pressurized chamber, the capacity of the pressurized chamber is kept small while still ensuring flexion of the inclined plates, and the volume of the viscous material is kept to a minimum. The soft elastic material could also be constructed along the inclined plates, and may be connected at the edges of the two plates, or alternatively separate pieces of soft elastic material are also inserted at the edges of the inclined plates. When large amounts of viscous material are permissible, the soft elastic material need not be formed along the inclined plates, and a soft material could be inserted only at the tips of the inclined plates.

In another suitable configuration, in the case where following the filling of the pressurized chamber with a viscous material using the aforementioned viscous material supply device the supply pressure of the viscous material supply device is cut, but even though the supply pressure has been cut the viscous material within the pressurized chamber still retains a degree of pressure, a pouch which functions as a discharge pressure regulating device absorbs this residual supply pressure remaining in the pressurized chamber, causing a reduction in the pressure inside the pressurized chamber. Accordingly, the residual pressure within the pressurized chamber is removed, and the discharge pressure is controlled using the aforementioned pouch.

Furthermore, in another suitable configuration, by providing a pressure detecting member at an internal edge of the pressurized chamber or between the pressure chamber and the viscous material supply device, then as the viscous material is supplied to the pressurized chamber by the viscous material supply device, the pressure detecting member detects when the pressurized chamber is full of the viscous material.

Furthermore in another suitable configuration, in those cases where during pressurization of the pressurized chamber by the discharge pressure regulating device, the detected pressure at pressure detecting member does not reach a predetermined pressure, a judgment is made that the amount of viscous material is insufficient, and the viscous material supply device is used to supply the viscous material to replenish the viscous material within the pressurized chamber.

In another suitable configuration, the pressurized chamber is moved while pressurized by the discharge pressure regulating device, and the pressure of the discharge pressure regulating device is regulated based on a pressure of the pressurized chamber detected with the pressure detecting member.

Furthermore in another suitable configuration, a rotatable shaft is provided in the pressurized chamber, and the viscous material is mobilized by rotating the shaft.

Furthermore in another suitable configuration, the viscous material is recovered into the pressurized chamber by setting the pressure of the pressurized chamber to a negative pressure by the discharge pressure regulating device following completion of discharge, and lifting the pressurized chamber while moving the chamber in a horizontal direction.

Moreover in another suitable configuration, the temperature of the viscous material is stabilized by exchanging the air inside an air pouch.

BRIEF DESCRIPTION OF THE DRAWINGS

FIG. 2A is a graph showing the responsiveness of the discharge pressure, and FIG. 2B is a graph showing the efficiency of the discharge pressure through a comparison with a conventional apparatus;

FIG. 5A and FIG. 5B show a fourth embodiment of the present invention, where FIG. 5A is a front view, and FIG. 5B is a side view;

FIG. 7A is a graph showing data according to the same embodiment, and FIG. 7B is a graph showing data according to a conventional example;

FIG. 8A is a graph showing data according to the same embodiment, and FIG. 8B is a graph showing data according to a conventional example;

FIG. 10A is a longitudinal cross-sectional view, and FIG. 10B is a graph showing a discharge pressure distribution for the same embodiment;

FIG. 11A is a schematic perspective view showing the essential elements, and FIG. 11B is a graph showing a discharge pressure distribution for the same embodiment;

FIG. 12A is a longitudinal cross-sectional view showing the state immediately following the completion of discharge of a viscous material, and FIG. 12B is a longitudinal cross-sectional view showing the state where the discharge pressure has been regulated following completion of discharge;

FIG. 14A is a longitudinal cross-sectional view, and FIG. 14B is a transverse cross-sectional view;

FIG. 15A is a perspective view showing an integrated type soft elastic material, and FIG. 15B is a perspective view showing a divided type soft elastic material;

FIG. 17A, FIG. 17B, FIG. 17C and FIG. 17D are cross-sectional views showing various states of an air pouch;

FIG. 24A and FIG. 24B show an example in which a shaft is positioned inside a pressurized chamber, where FIG. 24A is a longitudinal cross-sectional view, and FIG. 24B is a left side view;

FIG. 27A to FIG. 27E are diagrams showing an operation for recovering a viscous material from on top of a screen;

FIG. 28A to FIG. 28C are diagrams describing a method of rapidly returning a viscous material to room temperature, where FIG. 28A is a longitudinal cross-sectional view, and FIG. 28B and FIG. 28C are graphs;

BEST MODE FOR CARRYING OUT THE INVENTION

As follows is a description of a viscous material application apparatus according to an embodiment of the present invention, with reference to FIG. 1 through FIG. 28, and FIG. 33.

Figure 1:
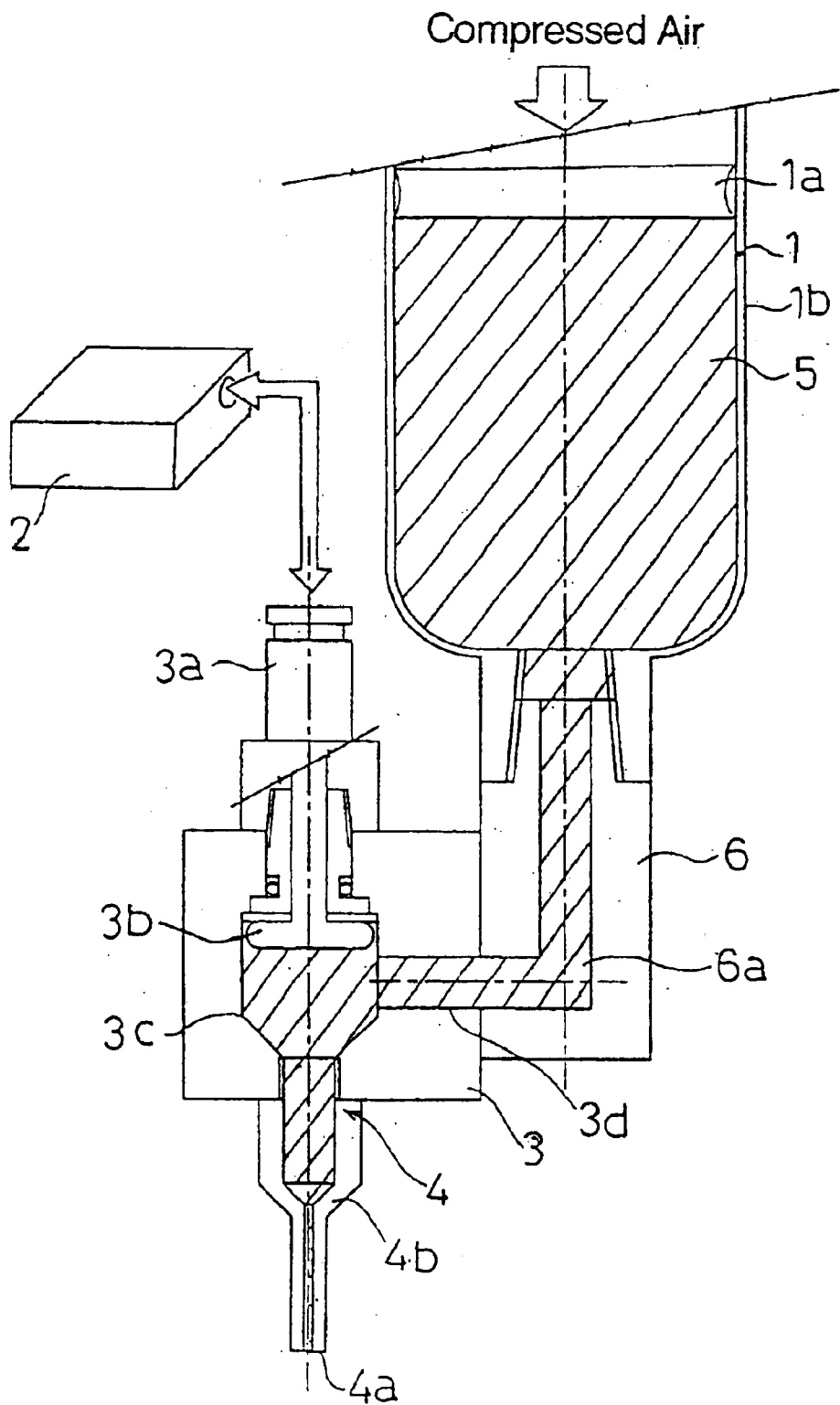
FIG. 1 is a longitudinal cross-sectional view showing a viscous material application apparatus according to a first embodiment of the present invention.

A viscous material application apparatus, according to a first embodiment shown in FIG. 1 comprises a material supply section 1, an air supply section 2, and an application unit 3 which forms a main body of the apparatus. The material supply section 1 contains a viscous material 5 such as an adhesive and cream solder stored inside a cylinder shaped storage tank 1b, and under the effect of compressed air used for material supply, a plunger 1a operates and pressurizes the viscous material 5, and transfers the viscous material under pressure so that the inside of a chamber (pressurized chamber) 3c of the application unit 3 is always full.

The application unit 3 and the material supply section 1 are connected by a joint 6, and by positioning a through aperture 6a provided in the joint 6 so that the through aperture 6a interconnects with a viscous material supply passage 3d provided horizontally in the side of the aforementioned chamber 3c, the viscous material 5 is supplied to the inside of the application unit 3.

A discharge nozzle 4b extends from a discharge section 4 at the bottom of the application unit 3. In contrast, the air supply section 2 is positioned at the top of the application unit 3, and compressed air from this air supply section 2, which has been adjusted to a predetermined pressure for use in material supply, is transferred into an air pouch 3b occupying the entire upper portion of the inside of the chamber 3c. In the first embodiment, this air pouch 3b and the aforementioned air supply section 2 make up the discharge pressure regulating device. Although compressed air was used in this embodiment, an inert gas such as nitrogen gas could also be used as the gas phase.

The air pouch 3b is formed from a pouch shaped vessel made of rubber or a resin material such as a urethane elastomer, polyethylene or nylon or the like, with a thickness of 0.03 mm to 1 mm for example. Furthermore, on consideration of the composition of the viscous material 5, the use of a solvent resistant material for the air pouch is also desirable. Preferred thickness for the air pouch is in the range of 0.3 mm to 0.5 mm. If the thickness of the air pouch 3b is overly thin, then there is a danger of the pouch rupturing. In particular, the air pouch 3b needs to be pressurized when the viscous material 5 is supplied into the chamber 3c, in order to absorb residual supply pressure remaining in the chamber 3c, and there is a possibility of the air pouch 3b rupturing at this time. Furthermore, if the thickness of the air pouch 3b is overly thick then there is a danger of deterioration in the responsiveness of the expansion and contraction of the pouch.

Furthermore as the air pouch 3b expands or contracts accompanying the inflow of compressed air from the air supply section 2 or the outflow of compressed air to the air supply section 2, the capacity of the chamber 3c inside the application unit 3 either decreases or increases. Accordingly, the viscous material 5 inside the chamber 3c is pushed out or sucked up under a predetermined pressure. Furthermore, by shortening the distance from the air pouch 3b to the discharge port 4a to approximately 10 mm for example, the responsiveness is improved.

Figure 2A:
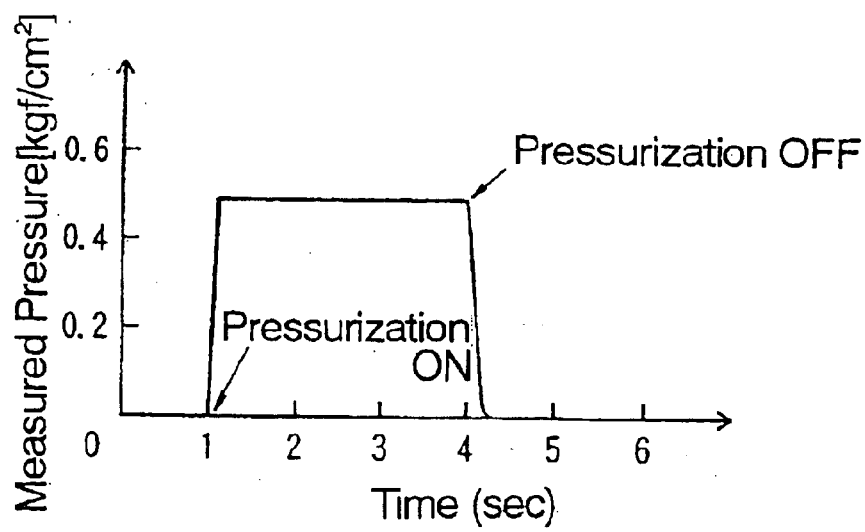
FIG. 2A and FIG. 2B show experimental data according to the same embodiment, where
Figure 2B:
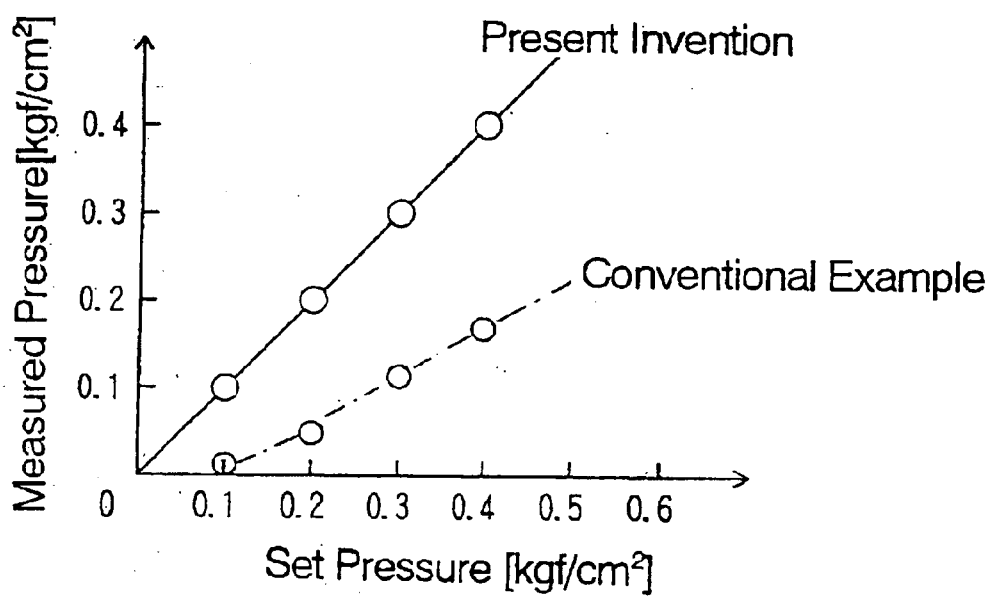

In other words, as shown in the graph of FIG. 2A, there is no waiting period from the point discharge is turned on until actual pressurization occurs, and there is no residual pressure at the completion of discharge. Experiments revealed that the discharge pressure reached the predetermined pressure transferred from the air supply section 2 within 0.3 to 0.5 seconds. Furthermore in the same manner, when the discharge is turned off, the pressure inside the chamber 3c following completion of the pressurization falls almost instantaneously to a value close to zero, enabling the discharge to be stopped. In addition, in the first embodiment, because the distance between the air pouch 3b and the discharge port 4a at the tip of the discharge nozzle 4b is small, the air pressure of the compressed air supplied to the air pouch 3b from the air supply section 2, and the discharge pressure of the viscous material discharged from the discharge port 4a are approximately equal, and this fact is confirmed by comparative experiments conducted with a conventional apparatus, as shown in the graph of FIG. 2B. In this manner, in the first embodiment, the efficiency of pressure transmission is improved by a discharge pressure regulating function which utilizes the expansion and contraction action of the air pouch 3b associated with the supply and exhaust actions of the air supply section 2, and the effects on the flow characteristics of the viscous material 5 stored in the chamber 3c are reduced. The exhaust action of the air supply section 2 is realized by either releasing the air inside the air pouch 3b into the atmosphere, or by suctioning the air out.

Figure 3:
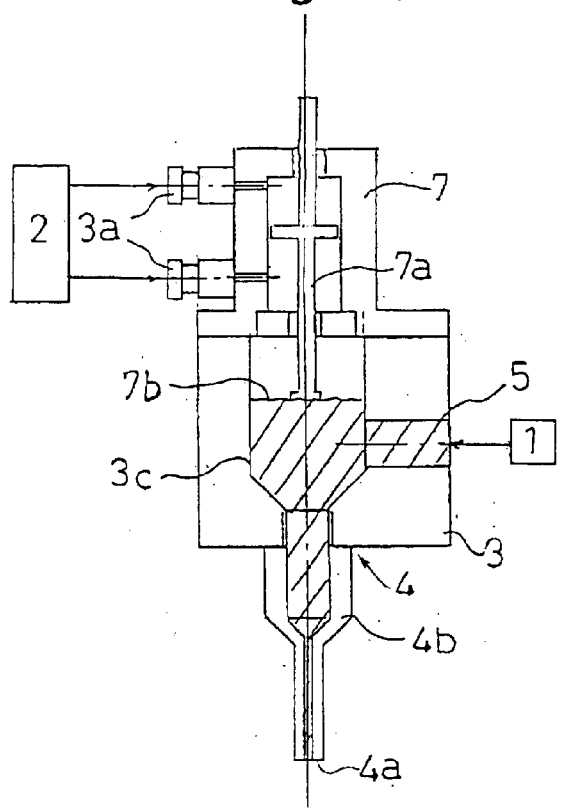
FIG. 3 is a longitudinal cross-sectional view showing a second embodiment of the present invention.

According to a second embodiment shown in FIG. 3, an air cylinder 7 which is connected to the air supply section 2 and a diaphragm 7b which is described below are used instead of the aforementioned discharge pressure regulating air pouch 3b. A piston 7a is provided in the air cylinder 7, and compressed air from the air supply section 2 which has been adjusted to a predetermined air pressure is supplied from an air port 3a, and accordingly the piston 7a moves up and down causing a deformation of the diaphragm 7b attached to the bottom end of the piston. This deformation of the diaphragm 7b causes an increase or a decrease in the capacity inside the chamber 3c, thereby applying pressure to, or releasing pressure from the viscous material 5. In addition to the device shown in the Figure, the diaphragm 7b may also utilize a bellows or the like.

Figure 4:
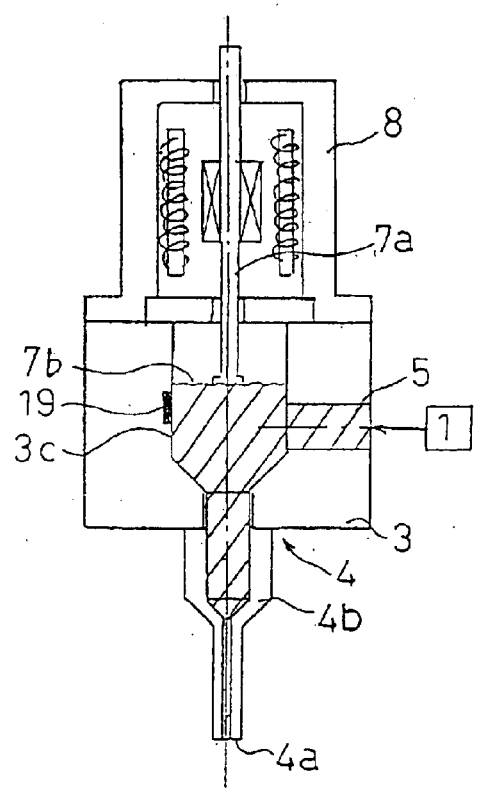
FIG. 4 is a longitudinal cross-sectional view showing a third embodiment of the present invention.
Figure 6A:
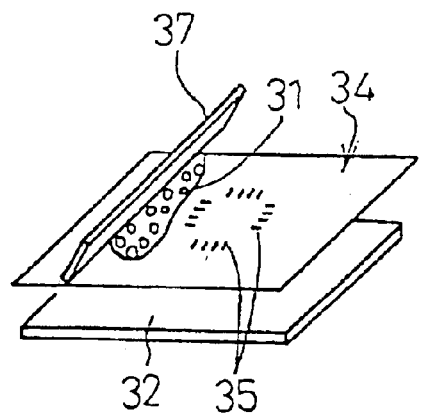
FIG. 6A to FIG. 6E are reference diagrams for the same embodiment, describing a process for applying a printing paste (viscous material) by screen printing in a sequence from FIG. 6A to FIG. 6E.
Figure 6B:
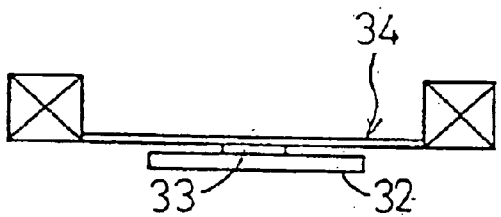
Figure 6C:
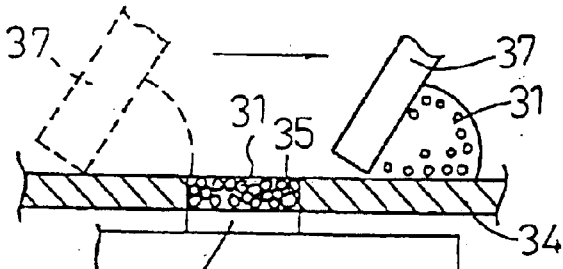
Figure 6D:
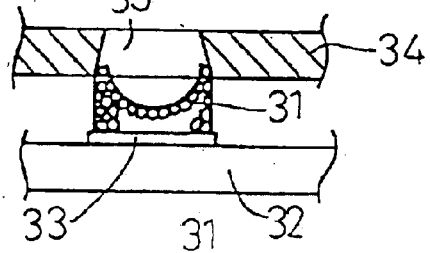
Figure 6E:
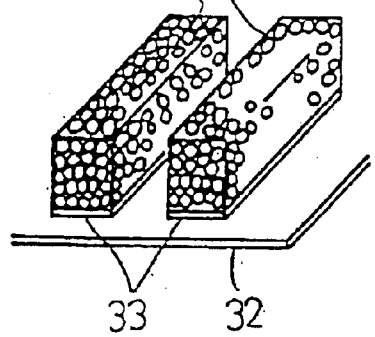

According to a third embodiment shown in FIG. 4, an electric motor 8 known as a voice coil motor (VCM) is used for driving the aforementioned piston 7a to achieve regulation of the discharge pressure. In the third embodiment, the mechanism wherein the deformation of the diaphragm 7b is used for increasing or decreasing the capacity inside the chamber 3c is the same as that of the second embodiment, although by using an electric drive, even faster responses is realized. The operating distance (the stroke) of the voice coil motor 8 is either controlled by attaching a pressure sensor 19 to the chamber 3c or near the tip of the piston 7a and then comparing the detected value with a set value, or alternatively the resistance value (the resistive force) generated during operation is read from the driver of the voice coil motor 8 and converted to a pressure, and this pressure value then used for control. In either case, in order to ensure efficient, immediate and precise transmission of the pressure, the distance between the drive source and the diaphragm 7b of the discharge pressure regulating device and the discharge port 4a needs to be reduced as far as possible.

A fourth embodiment shown in FIGS. 5A and 5B is an apparatus which regulates the discharge pressure using a discharge pressure regulating device similar to the air pouch shown in the first embodiment, although a feature of this embodiment is that by providing a plurality of material supply sections 1, and sharing a chamber 11a and a tube shaped air pouch 11b, the discharge pressure within a predetermined capacity is regulated in a single batch by the single discharge pressure regulating device.

Specifically, as shown in FIG. 6A–FIG. 6E, in order to mount an electrical component, in a printing apparatus such as a planograph and mimeograph system (screen system) for printing a viscous material (printing paste) 31 onto a land pattern 33 of a circuit board 32, a squeegee 37 is used for filling an opening 35 in a screen 34 positioned on the circuit board 32 with the viscous material 31, but in the present embodiment, instead of the squeegee 37, a thin blade (inclined plate) 12 described below is used under the operation of the aforementioned discharge pressure regulating device. In other words, a viscous material application apparatus according to the fourth embodiment is used as the print head of a screen printing machine.

According to the fourth embodiment, in the printing step where the viscous material 31 is used to fill the opening 35 in the screen 34, by increasing or decreasing the capacity of the chamber 11a by utilizing the gas intake and exhausting actions associated with the air pouch 11b positioned along the alignment direction of the material supply sections 1 and the discharge pressure regulating device (air supply section) 2 positioned in a single location at one end of the apparatus, highly accurate discharge pressure adjustments are performed for maintaining the filling pressure of the viscous material 31 entering the opening 35 at a suitable value, enabling an improvement in the printing quality. One example of this viscous material application apparatus has a length of 270 mm, and the viscous material 31 is stored in material supply sections 1, with one positioned centrally and the others positioned with a 85 mm separation to the left and the right, respectively. The viscous material 31 is transferred under pressure from a through aperture 9a with diameter of approximately 6 mm inside a joint 9 connected to the material supply section 1, into the chamber 11a inside the application unit 11. The chamber 11a is provided with an air port 11d for supplying compressed air from the air supply section 2, a joint 11e, and the air pouch 11b.

A shaft 11g and a pipe 11f with air holes for the intake or exhausting of air are mounted inside the air pouch 11b.

Because the length of the discharge port 14, at 270 mm, is quite long, the shaft 11g is provided to enable air to be transferred evenly and instantaneously into the air pouch 11b, thereby preventing the air pouch 11b, which is made of nylon tube of 0.05 mm in thickness, from deforming and protruding outside the chamber 11a. The joint 11e is connected to the pipe 11f. The air pouch 11b has a diameter of approximately 10 mm and a length of approximately 220 mm, and is connected to the joint 11e using an O-ring or the like to prevent air leaks.

Two thin blades 12 made of thin copper blades of 0.3 mm in thickness are attached at both sides at the bottom of the chamber 11a, and are held in position by blade weights 10 so as to approach one another in a downward direction leaving a spacing of approximately 10 mm, and in screen printing this arrangement replaces the conventional squeegee. In the fourth embodiment, the opening between the two thin blades 12, 12 forms the discharge port 14, and the viscous material 31 is discharged through this discharge port 14. Side plates 13 are fixed to the chamber 11a with side stoppers 15 of urethane rubber or the like disposed therebetween, to prevent the viscous material 31 from leaking out of the chamber 11a.

For viscous material application apparatus formed with three material supply sections 1 such as the apparatus described above, data results from comparative experiments comparing an apparatus utilizing discharge pressure regulating devices (an air supply section 2 and an air pouch 11b) similar to that of the fourth embodiment, and a conventional apparatus in which the viscous material 5 is discharged using only the compressed air for supplying material from the material supply section 1 are shown in FIGS. 7A to 8A.

Figure 7A:
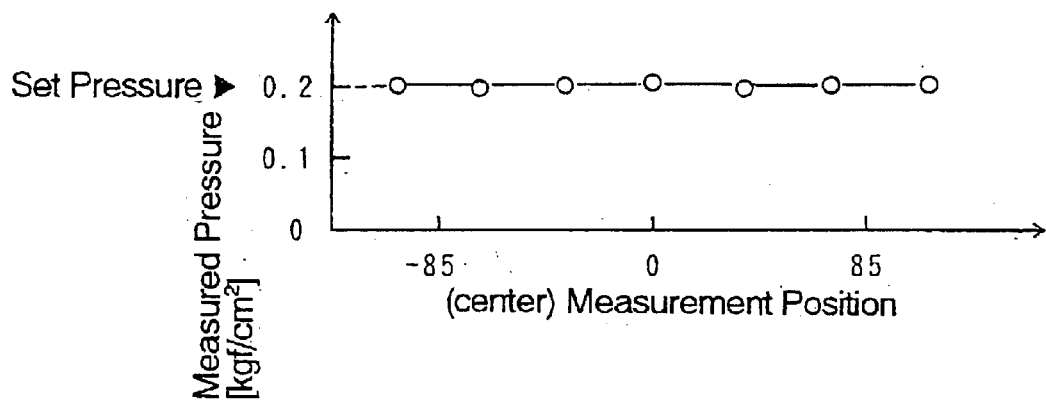
FIG. 7A and FIG. 7B show experimental data comparing variations in discharge pressure with a conventional example, where
Figure 7B:
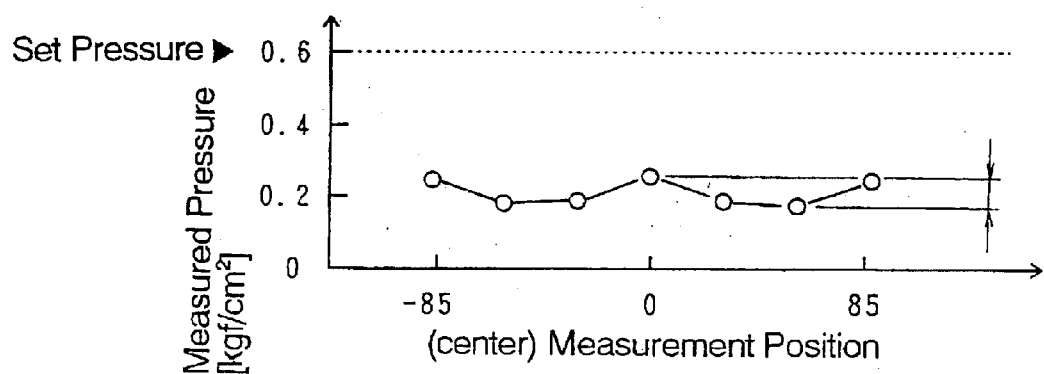

First, in terms of a comparison of the pressure variation between the three measurement positions, at the central section and at the left and right sections along the length of the apparatus, then in the case where the air pressure was set to 0.2 kgf/cm$^2$, the variation in the fourth embodiment was approximately 0.01 kgf/cm$^2$, as shown in FIG. 7A, and can effectively be ignored. However, in the conventional apparatus the variation was approximately 0.1 kgf/cm$^2$, as shown in FIG. 7B.

Figure 8A:
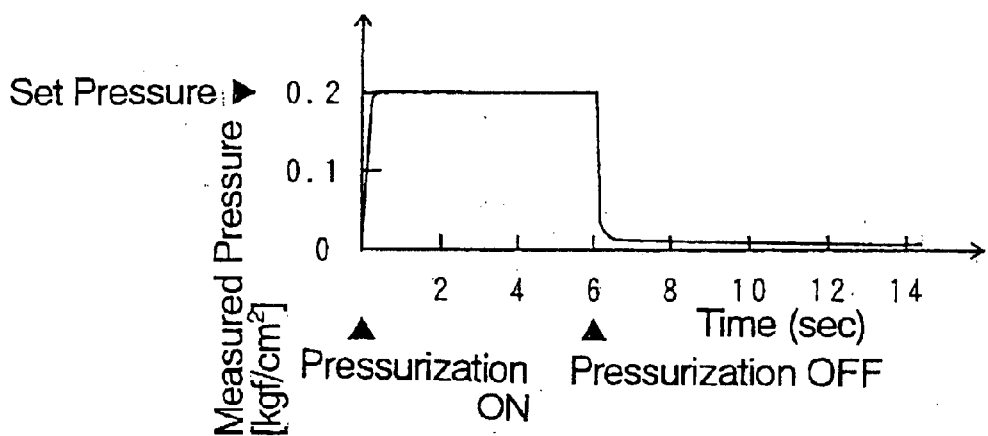
FIG. 8A and FIG. 8B show experimental data comparing the responsiveness of the discharge pressure with a conventional example, where
Figure 8B:
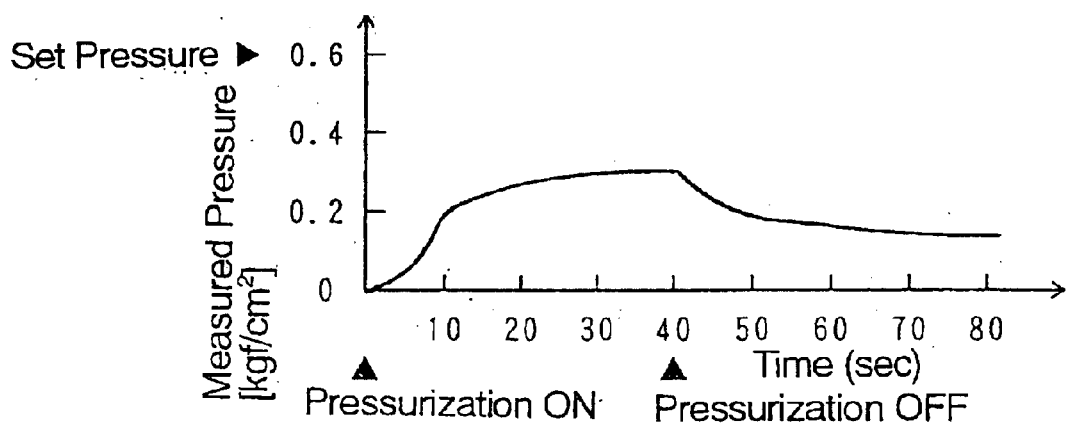

Next, is a comparison of the responsiveness of the discharge pressure, based on FIG. 8A and FIG. 8B. The filling pressure rise time was approximately 0.3 seconds for the fourth embodiment, as shown in FIG. 8A, whereas for the conventional apparatus the rise time was approximately 10 seconds. In a similar manner, following completion of the pressurization, whereas in the conventional apparatus a residual pressure of approximately 0.3 kgf/cm$^2$ remained in the chamber and moreover a period of approximately 30 seconds was required from stopping of the discharge until this residual pressure was reached, in the fourth embodiment the pressure inside the chamber 11a drops almost instantaneously. The reason for this immediate drop in pressure is that following completion of the pressurization, the air pouch 11b contracts and exhausts air to the air supply section 2 thereby removing the residual pressure within the chamber 11a.

Figure 9:
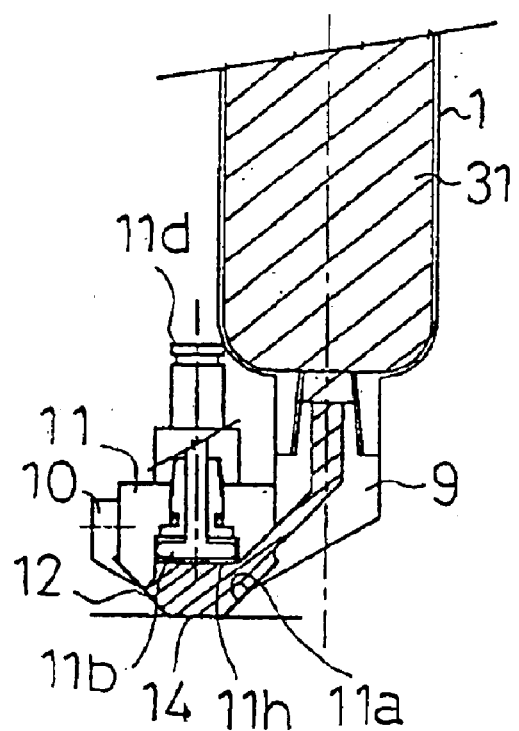
FIG. 9 is a longitudinal cross-sectional view showing a modified example of the same embodiment.

Furthermore as shown in FIG. 9, a design wherein a plate 11h is fixed to the top face of the viscous material 31 being pressurized by the air pouch 11b inside the chamber of the fourth embodiment, so that the viscous material 31 inside the chamber 11a spreads out uniformly, is also possible.

In a viscous material application apparatus according to the fourth embodiment described above, the viscous material 31 is pressurized inside the chamber 11a uniformly, and with a high degree of accuracy, and the viscous material 31 discharged from the discharge port 14 is applied uniformly along the length of the discharge port 14. However in a fifth embodiment shown in FIG. 10A, the discharge pressure is varied at each of the application positions.

Figure 10A:
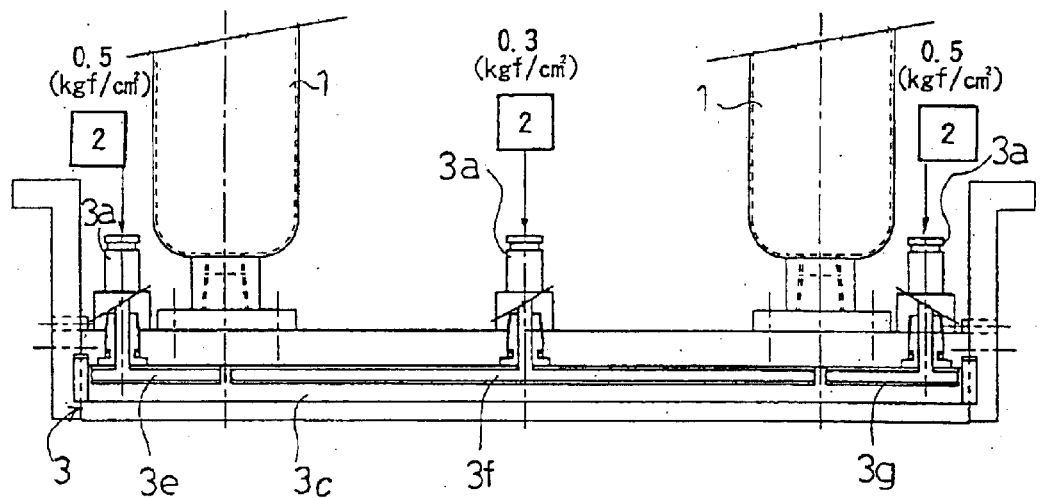
FIG. 10A and FIG. 10B show a fifth embodiment of the present invention, where
Figure 10B:
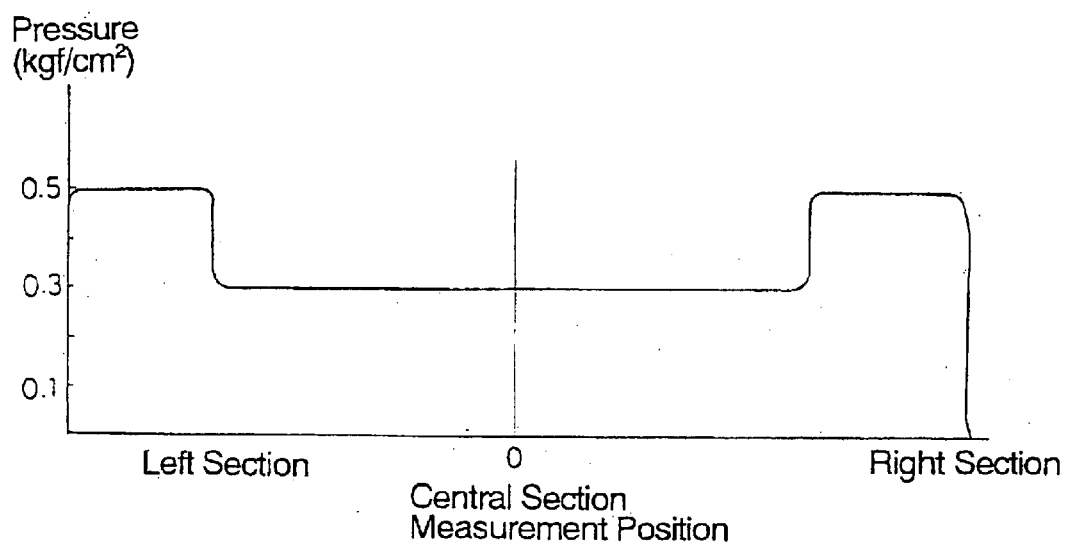

According to the fifth embodiment, material supply sections 1 are provided in two locations as shown in FIG. 10A, and air pouches 3f, 3e, 3g are provided in three locations in the central section and at the left and right sections, and are arranged with separate air ports 3a which interconnect with air supply sections 2. If the discharged viscous material has a high viscosity of approximately 200 Pa.s, such as a printing paste, then by setting the air pressure for the compressed air from the left hand and right hand air supply sections 2 to 0.5 kgf/cm$^2$ and setting the value for the central section to 0.3 kgf/cm$^2$, the discharge pressure from the chamber 3c is subjected to localized pressure regulation at the left section, the right section and the central section, as shown in FIG. 10B. In order to improve the accuracy of the localized pressure regulation even further, the chamber 3c could also be partitioned in accordance with the air supply sections 2.

Figure 11A:
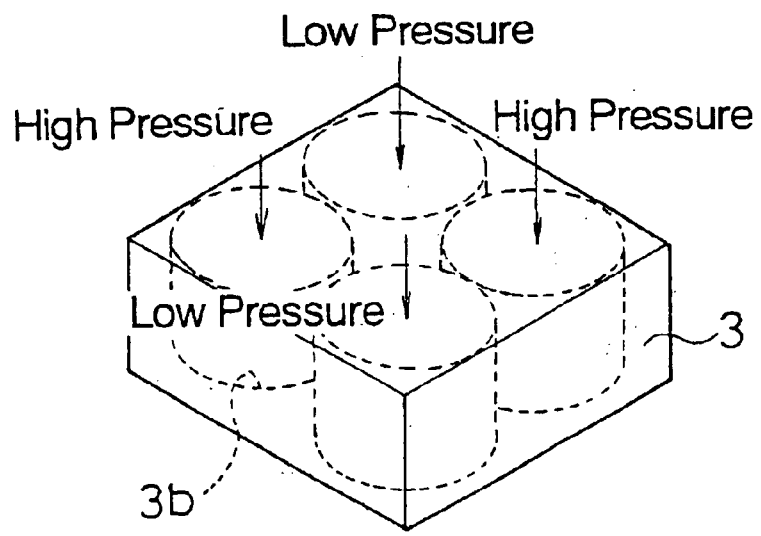
FIG. 11A and FIG. 11B show a sixth embodiment of the present invention, where
Figure 11B:
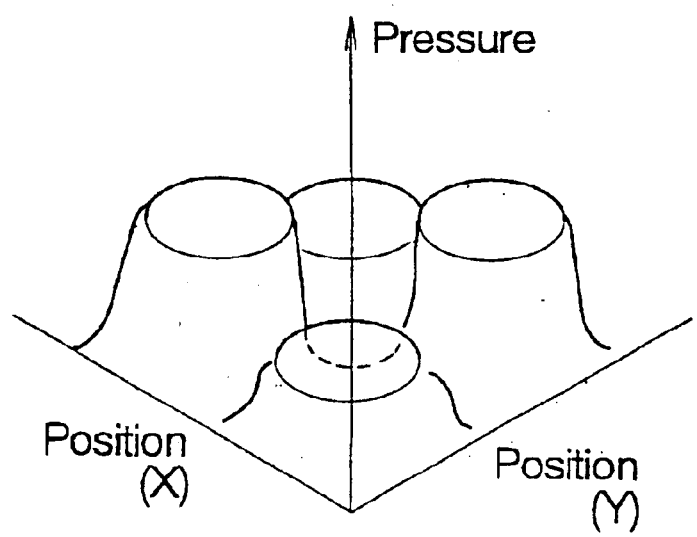

Furthermore, the plurality of air pouches 3e, 3f, 3g need not necessarily be positioned in a straight line as in the apparatus described above, and in a sixth embodiment shown in FIG. 11A, by arranging a plurality of air pouches 3b in parallel, the discharge pressure is varied within a single application unit 3, and a desired pressure distribution is created. FIG. 11B is a graph showing that pressure distribution.

Figure 12A:
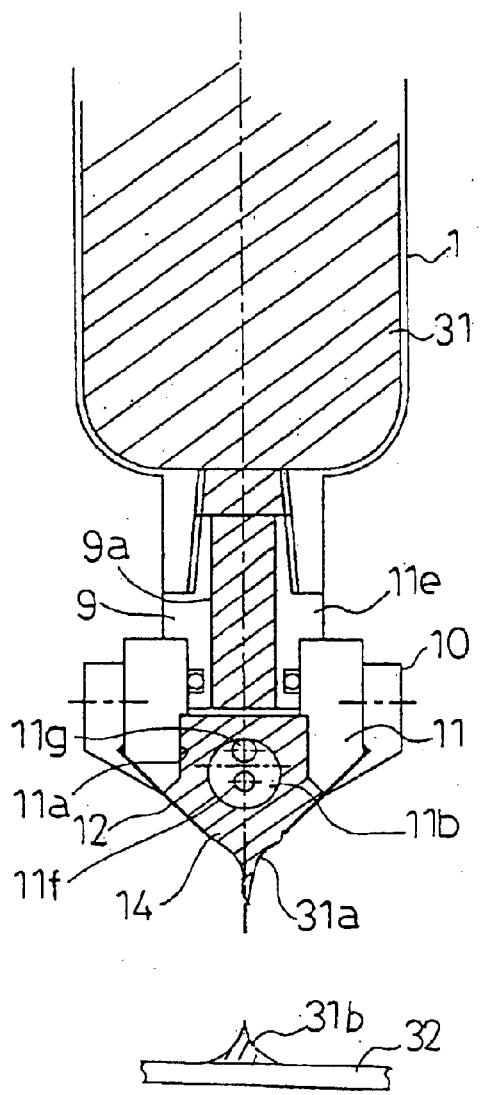
FIG. 12A and FIG. 12B are diagrams showing the action of the present invention using the fourth and the fifth embodiments, where
Figure 12B:
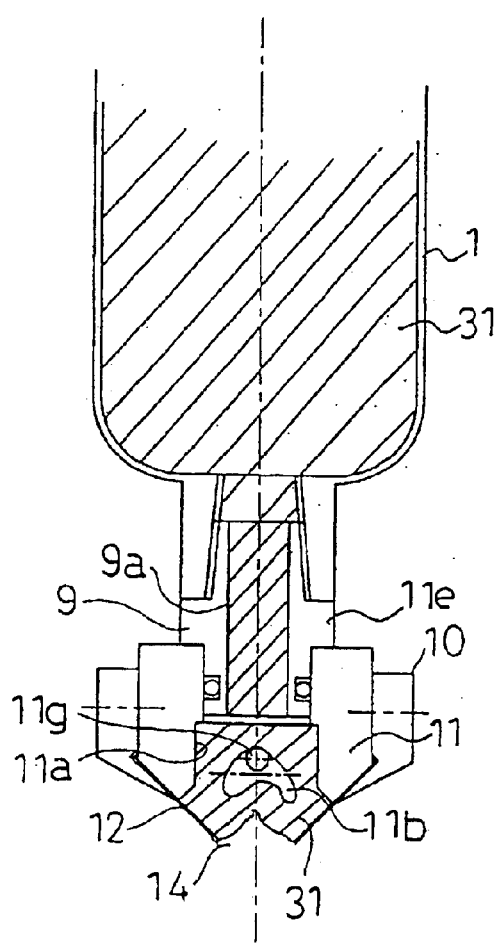

FIG. 12A and FIG. 12B are diagrams showing the suction action on the viscous material 31 when the discharge port 14 is moved away from the application target 32 following discharge of the viscous material 31 from the viscous material application apparatus and application of that viscous material onto the application target 32, for the apparatus of the embodiment 4 and the embodiment 5. In this case, the viscous material 31 near the discharge port 14 is pulled apart between the application target 32 and the discharge port 14, and a portion of the viscous material 31b is applied to the application target 32, and the remaining viscous material 31a is left hanging down from the discharge port 14. However as shown in FIG. 12B, by suctioning air from the air pouch 11b via the pipe 11f with air holes, the air pouch 11b contracts and the viscous material 31a hanging down is returned to the inside of the chamber 11a.

In other words, when the viscous material application apparatus is repositioned on top of the application target 32, then if done so in the state shown in FIG. 12A, the viscous material 31 adheres to the area surrounding the discharge port 14 (the surfaces of the opening to the chamber 11a). However if, as shown in FIG. 12B, the dangling viscous material 31a is suctioned inside the chamber 11a using air suction such as that described above, then even if the discharge port 14 is repositioned on top of the application target 32 for reprinting, the viscous material 31 does not protrude out, and the surface of the application target 32 is kept in a clean state. The pressure required for performing this suction is supplied by the air supply section 2, and the pressure for the suction action need only be sufficient to contract the air pouch 11b, with values of −0.2 kgf/cm$^2$ to −0.3 kgf/cm$^2$ being suitable.

Figure 13:
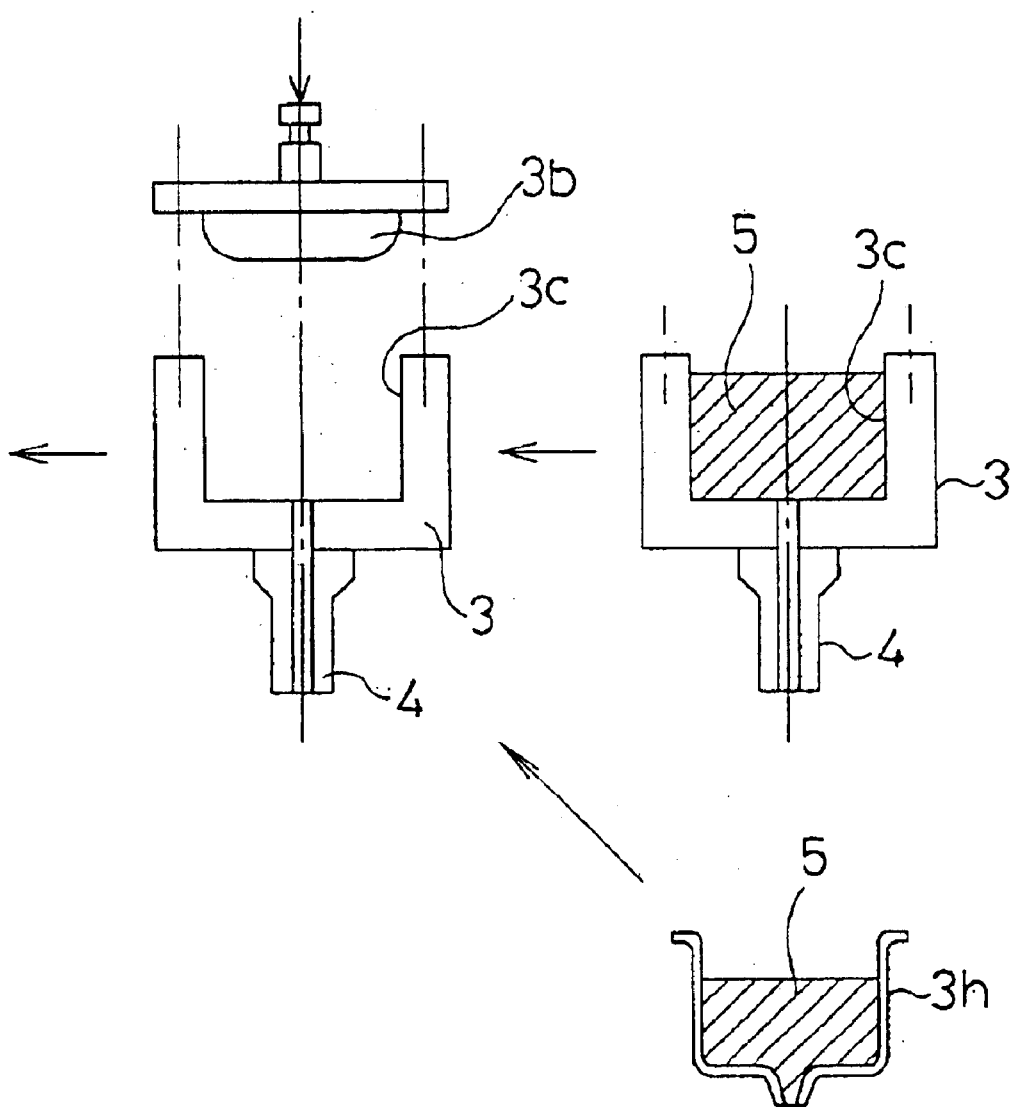
FIG. 13 is a longitudinal cross-sectional view describing the essential elements of a seventh embodiment of the present invention.

FIG. 13 shows a seventh embodiment. In the above embodiments supply of the viscous material 5 to the chamber 3c formed inside the application unit 3 was carried out using compressed air, but the supply device is not restricted to this configuration. For example in the seventh embodiment, the application unit 3 is formed so as to be detachable from the air pouch 3b, and supply of the viscous material 5 is carried out by exchanging this application unit 3 with a new application unit 3 filled with the viscous material 5. Supply of the viscous material 5 may also be carried out by exchanging a cartridge 3h formed such as to be accommodated within the chamber 3c. In such a case, the internal space of the cartridge 3h forms the chamber (pressurized chamber) inside the application unit 3. The material of the cartridge 3h may be any material capable of being accommodated in the chamber 3c such as nylon, a fluorine based system, a metal system, or a non-metal system.

Figure 14A:
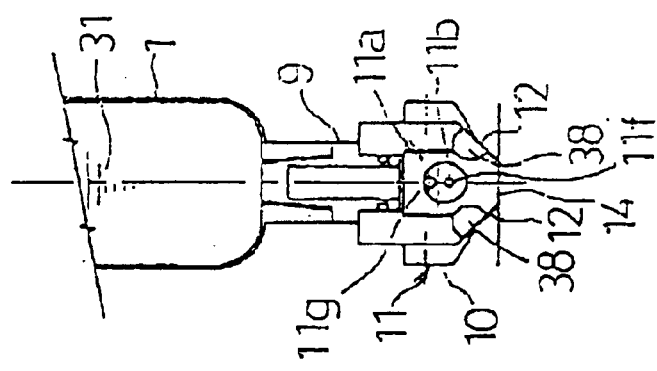
FIG. 14A and FIG. 14B show an eighth embodiment of the present invention, where
Figure 14B:
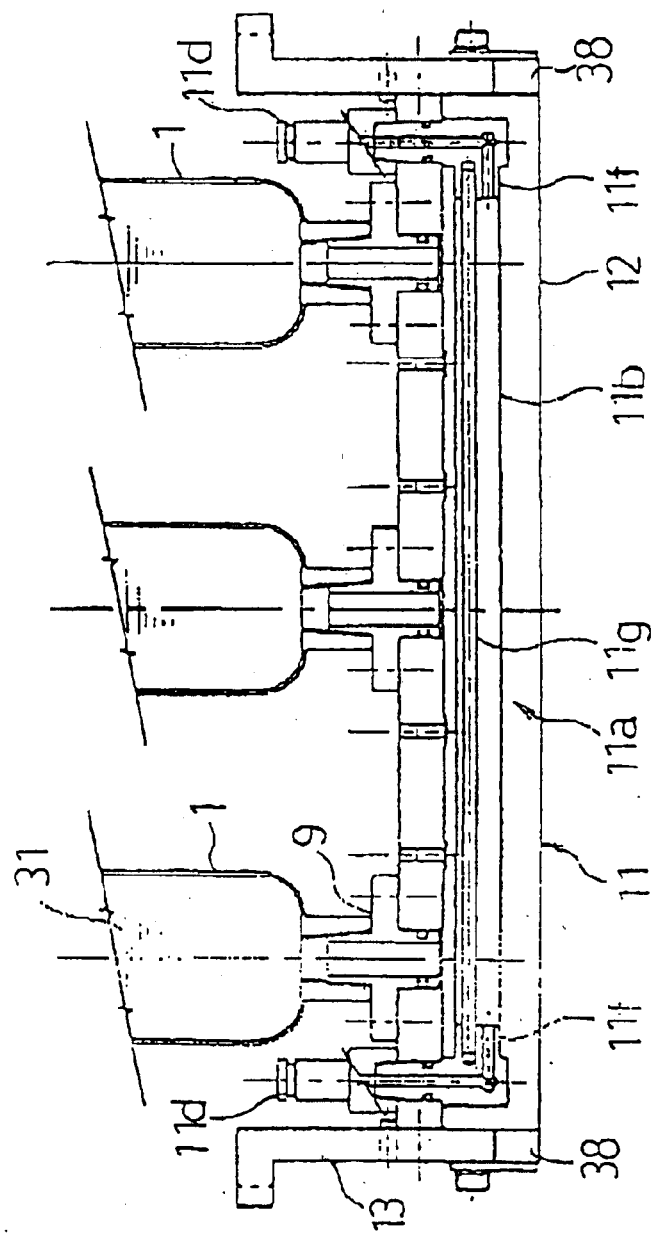

An eighth embodiment shown in FIG. 14A and FIG. 14B is an apparatus in which the discharge pressure is regulated using a discharge pressure regulating device similar to the air pouch 11b shown in the fourth embodiment, wherein a plurality of aligned material supply sections 1 share a chamber 11a and an air pouch 11b, the discharge pressure within a predetermined capacity is regulated in a single batch using the single discharge pressure regulating device, and a soft elastic material 38 as inserted between the lower side surfaces of the chamber 11a and the thin blades (inclined plates) 12.

Even without the soft elastic material 38, when the viscous material 31 is supplied to the chamber 11a or when the viscous material 31 inside the chamber 11a is pressurized, by pressing the application unit 11 down onto the screen and causing the thin blades 12 to flex, the adhesion to the screen can be improved, and any leakage of the viscous material 31 from between the thin blades 12 and the screen can be prevented. However, in order to improve the adhesion even further, and enable any waviness or the like within the screen to be followed, the thin blades 12 need to be lengthened and the flexion of the thin blades 12 increased. However, such lengthening causes the capacity of the chamber 11a to increase and the amount of supplied viscous material 31 to increase, which invites an increase in the supply time and an increase in the weight of the application unit 11.

By inserting the soft elastic material 38 between the thin blades 12 and the lower side surfaces of the chamber 11a, the capacity of the chamber 11a is kept small while still ensuring flexion of the thin blades 12, and the volume of the viscous material 31 is kept to a minimum. The soft elastic material 38 is constructed along the thin blades 12, and may be connected at the edges of the two thin blades 12 forming a single integrated unit, as shown in numeral 38a of FIG. 15A, or alternatively may be divided into a pair of left and right soft elastic materials 38b formed along the thin blades 12 and another pair of soft elastic materials 38c formed at the two edges of the thin blades 12, as shown in FIG. 15B. In cases where large amounts of the viscous material are permissible, the soft elastic material 38 need not be formed along the thin blades 12, and the soft material 38 is inserted only at the two edges of the thin blades 12. Furthermore, the soft elastic material 38 may be fixed to the chamber 11a, or may also be simply inserted between the chamber 11a and the thin blades 12 or a separate plate from the edges of the thin blades 12. Furthermore, the flexion of the thin blades 12 could also be ensured by reducing the thickness of the thin blades 12 or by using a resin based material.

As described above, when a viscous material application apparatus of this embodiment is used as a print head in a screen printing machine, by allowing a large degree of flexion for the thin blades 12, any waviness or the like within the screen is followed, and the viscous material 31 is scraped with the thin blades 12 even if there is no circuit board beneath the screen.

Furthermore during printing, the application unit 11 is often configured to enable free movement up and down to enable the screen to be followed, although restricting the up and down movement of the application unit 11 in order to effectively utilize the flexion of the thin blades 12 is preferable in that it enables the thin blades 12 to move up and down and the viscous material 31 to be scraped.

Moreover the soft elastic material 38, in addition to being soft, should preferably be solvent resistant, and suitable materials include a soft polyethylene or urethane rubber for example, although if the material is to be exchanged periodically, then silicon rubber and more particularly foam based silicon rubber, which is a soft material, is also suitable. In addition, if a material with a high degree of hardness such as fluorine based material is joined to, or coated onto the surface of the soft elastic material 38 facing the screen, then the slipperiness is improved and the life of the soft elastic material 38 is extended.

Figure 16B:
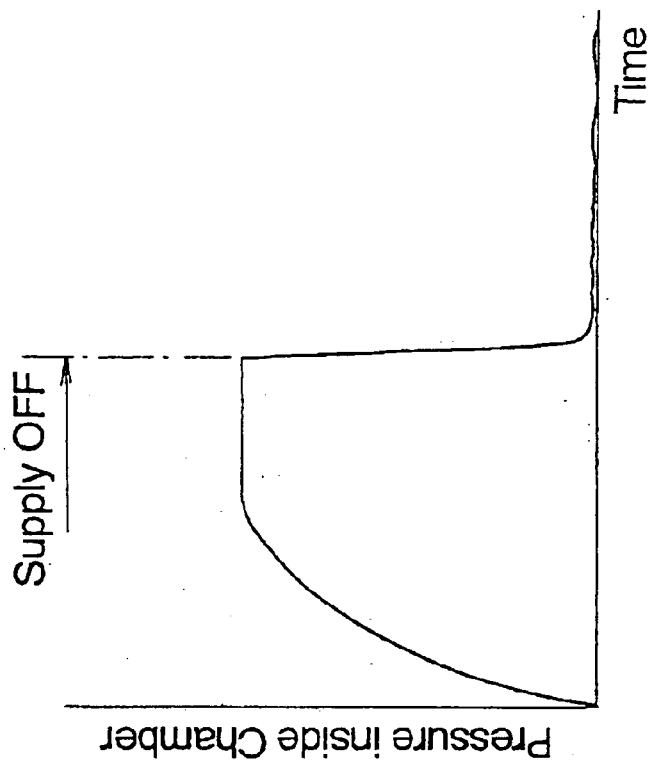
FIG. 16A and FIG. 16B are graphs showing the removal of residual pressure from inside a pressurized chamber by an air pouch.
Figure 16A:
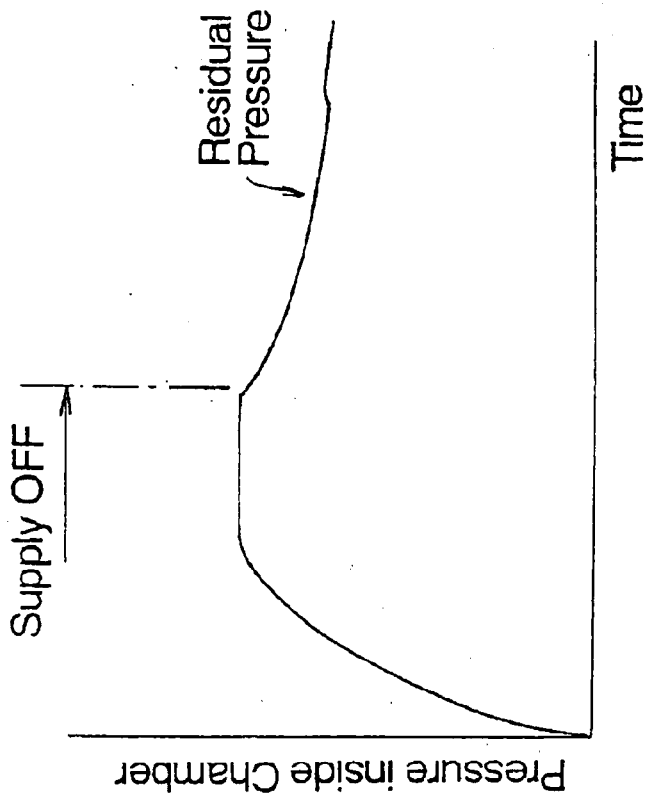

Next is a comparison of pressure levels within the chamber 11a using FIG. 16A and FIG. 16B. When the supply pressure to the material supply section 1 is cut following the filling of the chamber 11a with the viscous material 31 from the material supply section 1, then as shown in FIG. 16A, the viscous material 31 inside the chamber 11a retains a certain amount of pressure (hereafter referred to as the residual pressure) even though the supply pressure has been cut, and this residual pressure does not decrease significantly even after several minutes have passed. The discharge pressure is generated by the air pouch 11b, and although the discharge pressure can be controlled by the air pouch 11b in those cases where the residual pressure is smaller than the discharge pressure, control of the discharge pressure becomes difficult in those cases where the residual pressure is larger than the discharge pressure.

Accordingly, if the air pouch 11b is inflated when supply pressure is applied to the material supply section 1, or during the supply process, and then when the supply pressure is cut at the point the inside of the chamber 11a becomes filled with the viscous material 31, if the air for the air pouch 11b is also cut, the deflation of the air pouch 11b enables the residual pressure within the chamber 11a to be absorbed, and as shown in FIG. 16B, the residual pressure inside the chamber 11a is reduced within a period of no more than 1 second. Consequently, the pressure within the chamber 11a disappears, and the discharge pressure is controlled by the air pouch 11b.

At this time, as shown in FIG. 17A, the air pouch 11b may be provided in a separate chamber 11m from the chamber 11a so as not to inhibit the movement of the viscous material 31 within the chamber 11a (in such a case, the pressurized chamber of the present invention includes both 11a and 11m), or alternatively similar effects are achieved by providing the air pouch 11b in the upper portion of the chamber 11a. The air pouches 11b described up until this point have had a circular cross section (FIG. 17A), although the same effects are obtained using an air pouch 39a which collects air in a sheet like shape such as that shown in FIG. 17B, or an air pouch 39b which collects air in a bag type arrangement such as that shown in FIG. 17C. Applying these possibilities, the same effects are also obtained by forming the pressurized chamber (chamber) 11a in a pouch shape, and using an elastic material pouch (air pouch) 39c so that the region the air enters becomes a chamber, as shown in FIG. 17D. In this embodiment, the description outlined an apparatus in which the thin blades were made of copper with a thickness of 0.3 mm, but copper, stainless steel or resin (polyimide or combination of polyamide and polyimide or the like) plates with an approximate thickness of 0.1 mm to 0.5 mm may also be used.

Figure 33:
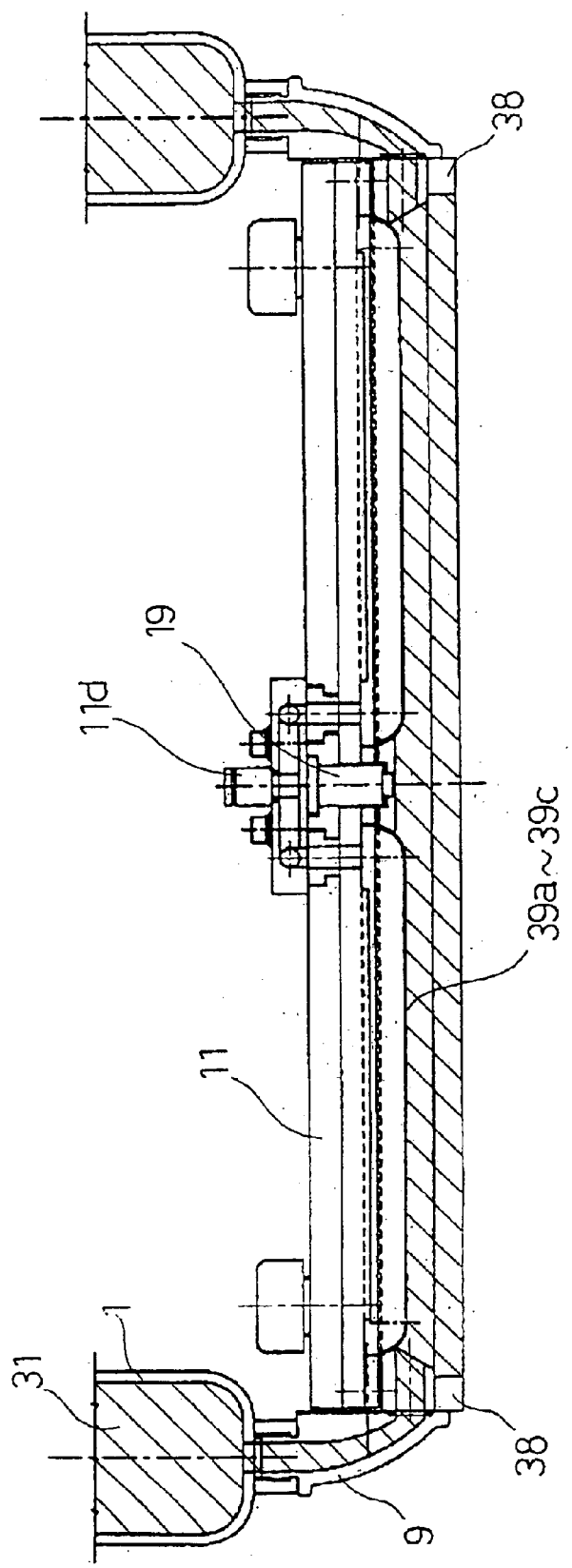
FIG. 33 is a diagram of a modified embodiment of the present invention, showing an example where joints are positioned at the left and right sides of an application unit.

Furthermore in the present embodiment, the left and right joints 9 between the material supply sections 1 and the application unit 11 were positioned in the upper portion of the application unit 11 as shown in FIG. 5, but these joints may also be positioned on the left and right side surfaces of the application unit 11, as shown in FIG. 33, with the viscous material 31 from the material supply sections 1 being supplied from the side surface of the chamber 11a. So doing enables the supply of the viscous material 31 to the chamber 11a to be carried out smoothly.

Figure 18:
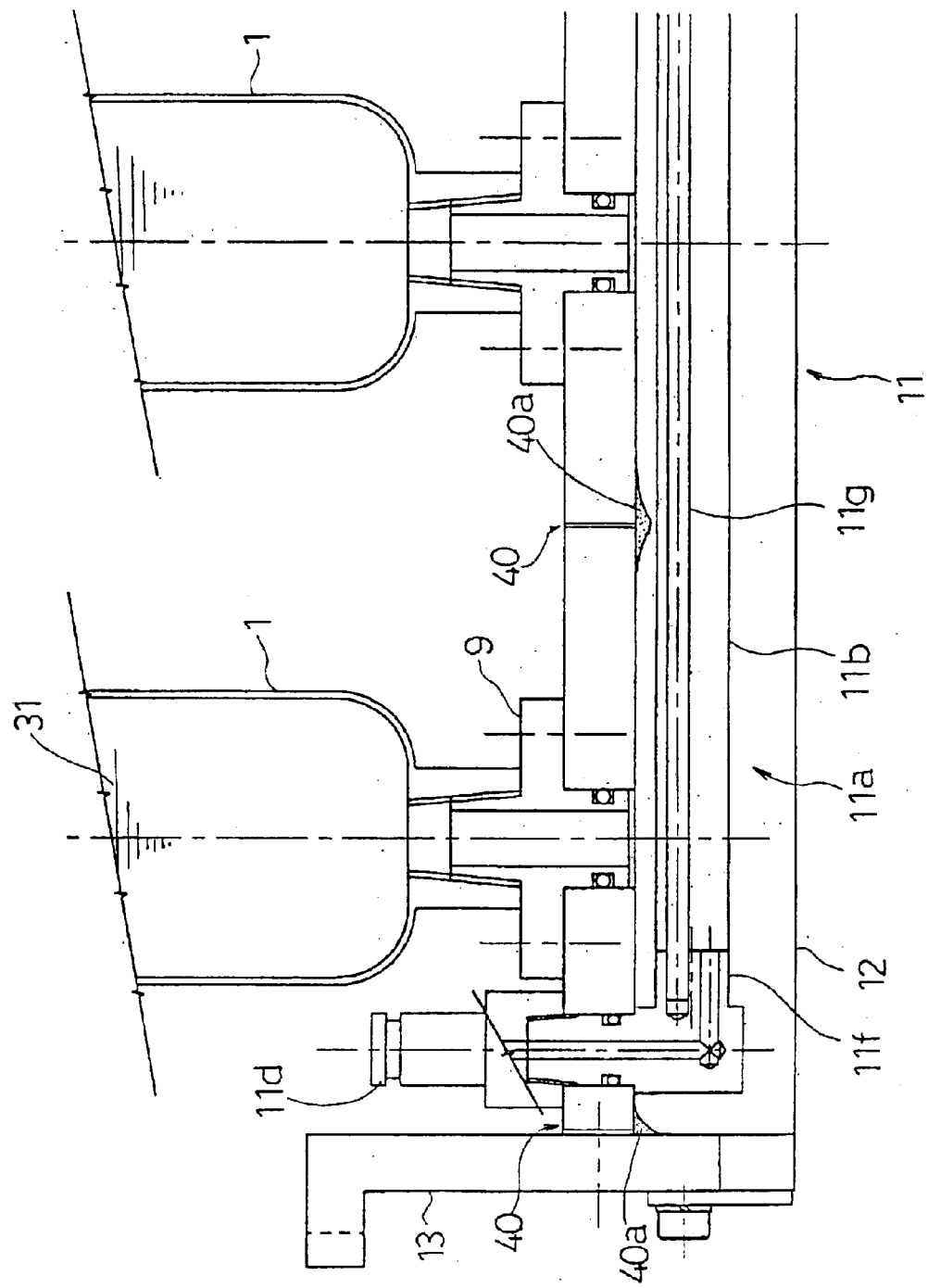
FIG. 18 is an explanatory diagram showing a slit for removing air.
Figure 19:
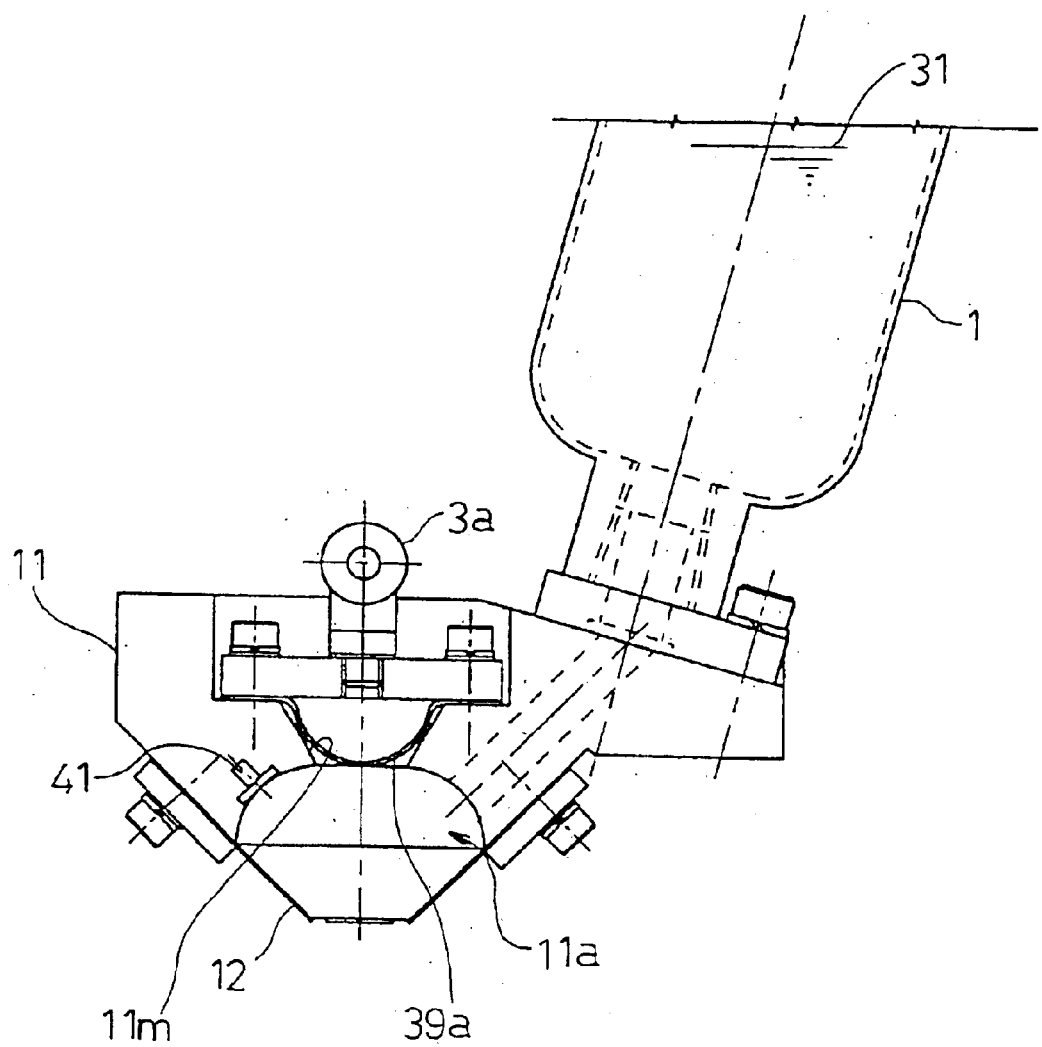
FIG. 19 is an explanatory diagram showing pressure detecting member inside a pressurized chamber.

Next, as shown in FIG. 18, when the viscous material 31 is supplied into the chamber 11a, there are occasions when an air pocket 40a remains in the chamber 11a even when the chamber 11a is full. Because the inside of the chamber 11a is subjected to a uniform pressure by the air pouch 11b, the same pressure will be applied to the air pocket 40a, and no significant problems arise accordingly, but if an air vent 40 such as a minute hole or a slit is provided to allow even more accurate pressure control, then the air within the air pocket 40a is vented. At this time, because the hole or slit is minute, the resistance to the viscous material 31 seeping out is very high, and so the viscous material 31 will not seep out through the air vent 40.

Next is a description of the detection of when a chamber 11a is filled with the viscous material 31. When a supply pressure is applied to the material supply section 1 and the viscous material 31 is supplied to the chamber 11a, the supply pressure may be applied for a predetermined length of time, although by providing at least one pressure detecting member 41 either on an inside edge of the chamber 11a or between the chamber 11a and the material supply section 1, the state where the chamber 11a is filled with the viscous material 31 is detected using the pressure detecting member 41.

Figure 20:
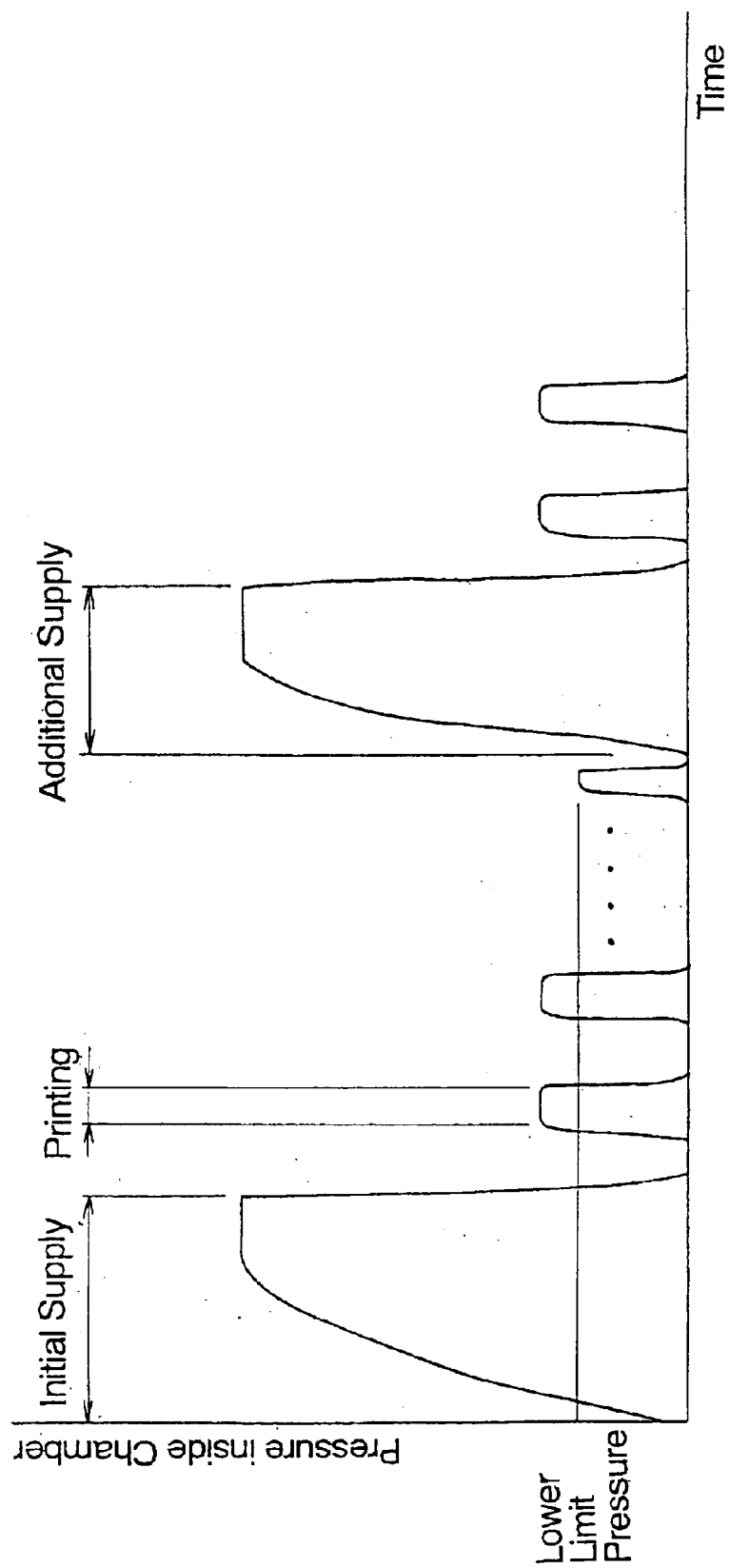
FIG. 20 is a graph showing the pressure inside a pressurized chamber when an initial supply and an additional supply are carried out.

As follows is a description of a method of supplying the viscous material 31 during printing, based on FIG. 20. The method for the initial supply of the viscous material 31 into the chamber 11a is the same as that described above, and when the inside of the chamber 11a is full, the air pouches 11b, 39a, 39b, 39c (hereafter recorded as simply 11b) are inflated and printing is started. As the printing occurs, the amount of the viscous material 31 gradually decreases, but as long as the air pouch 11b is inflated, a predetermined pressure is generated inside the chamber 11a and printing is continued.

When the air pouch 11b becomes fully inflated and no longer fills the capacity generated by the reduced viscous material 31, the pressure inside the chamber 11a falls, and reaches a preset lower limit pressure necessary for printing. By detecting the lower limit pressure inside the chamber 11a with the pressure detecting member 41, the reduction in the amount of the viscous material 31 is detected, and by then carrying out the same operations as those used during the initial supply to re-supply the inside of the chamber 11a with the viscous material 31, the air pouch 11b can once again be inflated, enabling a discharge pressure to be generated and the printing to be continued.

At this time, if residual pressure within the chamber 11a is not a problem then only the material supply section 1 need be operated, but in cases where residual pressure is a problem, it may be necessary to remove the residual pressure using the air pouch 11b.

Furthermore, in those cases where the supply timing of the viscous material 31 is known beforehand, then the viscous material 31 may be supplied in accordance with a set timing such as the number of printings, without detecting the lower limit pressure, and in cases where the viscosity of the viscous material 31 is low, a normal low supply pressure may be applied, and the viscous material 31 supplied a little at a time.

Figure 21:
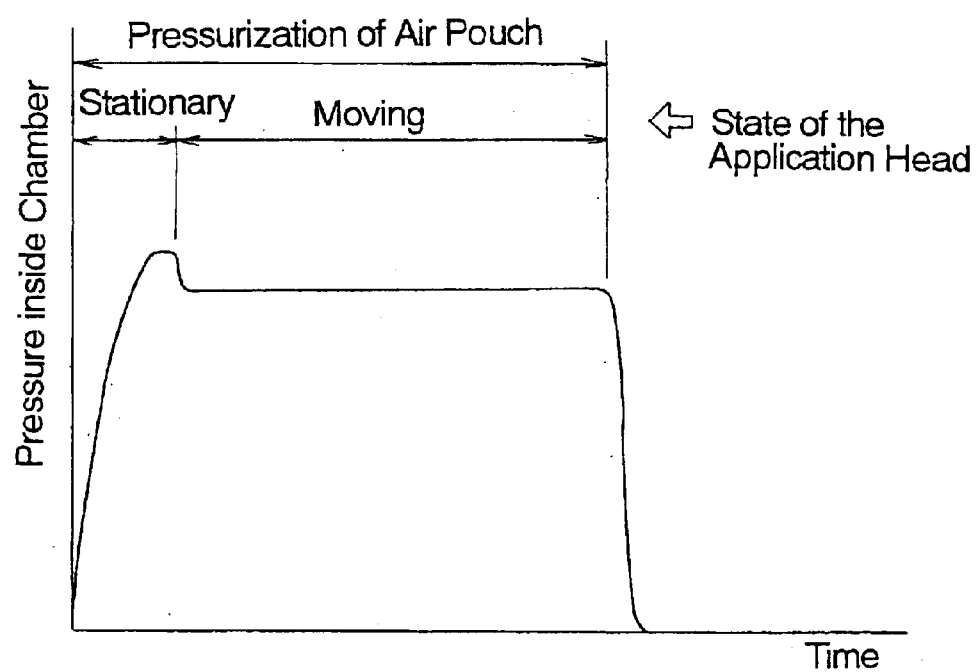
FIG. 21 is a graph showing the pressure inside a pressurized chamber during printing.

Next, the pressure inside the chamber 11a during printing is described with reference to FIG. 21. By inflating the air pouch 11b, the pressure inside the chamber 11a is raised instantaneously, and printing is then carried out by moving the application unit 11. During this time, because the movement of the application unit 11 causes the viscous material 31 to move inside the chamber 11a, the pressure detected by the pressure detecting member 41 will be lower than that detected when the application unit 11 is stopped.

If the screen opening is such that this difference in pressure does not cause any problems, then the air pouch 11b can be left inflated at a predetermined pressure, but if problems arise, then the pressure during actual printing should also be detected, and the difference in the pressure inside the chamber 11a between the case when the application unit 11 is stopped and the case when at is moving is used in considering the movement state of the viscous material 31. Particularly in the case where the pressure difference inside the chamber 11a is large, often this indicates the viscous material 31 is easily moved, in other words the case where the viscosity has fallen, and so the pressure of the air pouch 11b needs to be reset in accordance with the degree of this fall in pressure.

This resetting of the pressure is a way of correcting the relationship with the viscosity of the viscous material 31, and so if the relationship between the viscosity, the detected pressure and the set pressure has already been determined in advance, then this resetting can be performed automatically even during printing. Furthermore even if the viscosity of the viscous material 31 varies with a variation in temperature or with extended usage or the like, by resetting the pressure of the air pouch 11b by conducting a comparison with the pressure measured during the previous printing, stable printing is achieved.

Furthermore by applying pressure to the air pouch 11b prior to the start of printing, and moving the application unit 11 at a position with no screen opening, then the pressure of the air pouch 11b is reset even without actually conducting any printing.

Figure 22:
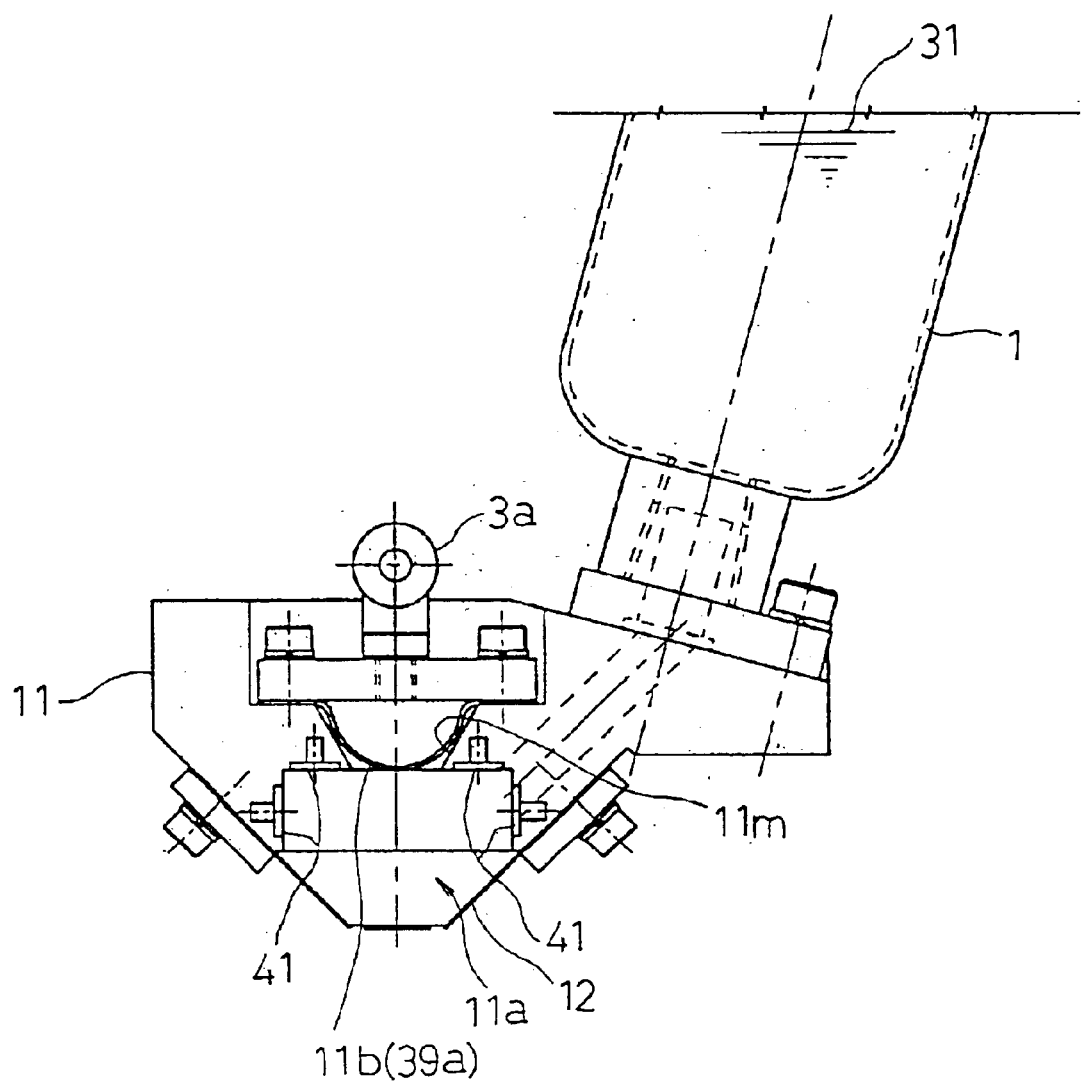
FIG. 22 is an explanatory diagram showing pressure detecting member inside a pressurized chamber.

Furthermore, by providing a plurality of pressure detecting members 41 around the perimeter of the inside of the chamber 11a, as shown in FIG. 22, the pressure state of the viscous material 31 is detected with greater accuracy, and detection of movement of the viscous material 31 inside the chamber 11a also becomes possible. If the pressure difference between the pressure detecting members 41 is large, then the movement of the viscous material 31 is poor, in other words the viscosity is high, and so the pressure of the air pouch 11b (39a) is set to a large value, whereas if the pressure difference between the pressure detecting members 41 is small, then the movement of the viscous material 31 is good, in other words the viscosity is low, and so the pressure of the air pouch 11b is set to a small value.

Figures 23A, 23B:
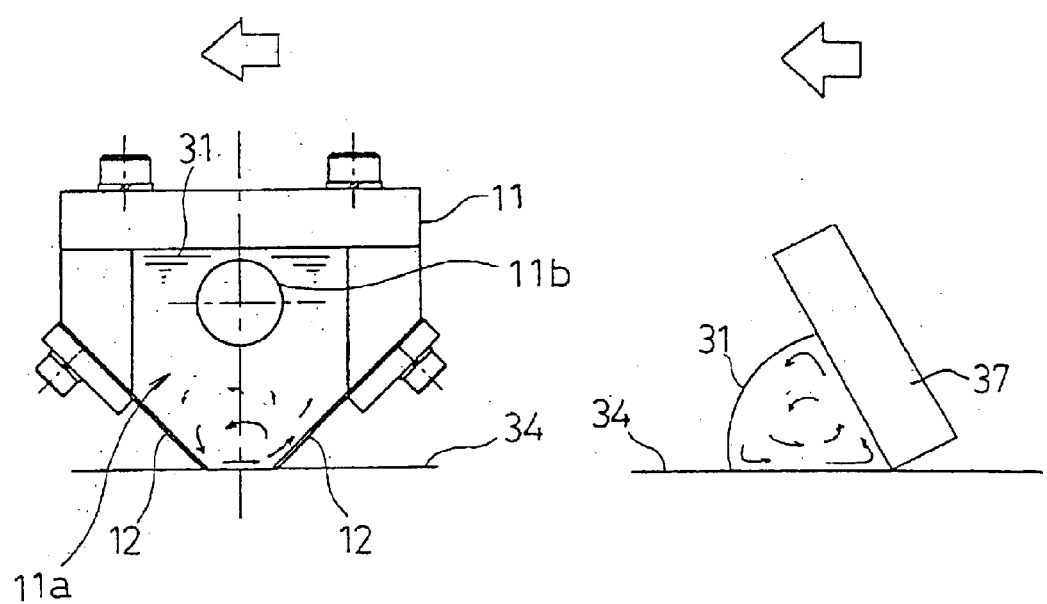
FIG. 23A and FIG. 23B are diagrams showing the flow of a viscous material.

Next is a description of a method of promoting the flow of the viscous material, based on FIG. 23A and FIG. 23B. If the viscous material 31 which fills the inside of the chamber 11a is moved across the top of a screen 34 with a discharge pressure applied, as shown in FIG. 23A, then a circulating flow develops in the same direction as the direction of movement. In the case where a discharge pressure is not applied, this flow does not occur, and because the viscous material 31 slides over the screen 34 it is unlikely to enter the opening in the screen 34 and so printing cannot be conducted. In other words, the flow of the viscous material 31 enables the viscous material 31 to enter the opening in the screen 34, thereby enabling printing to be carried out.

As shown in FIG. 23B, this phenomenon is the same as the case where a squeegee 37 is used for printing, and when the squeegee 37 is moved the viscous material 31 undergoes a circulating flow in the same direction.

Furthermore, in the case of this squeegee system, in order to promote the mobility of the viscous material 31, the viscous material 31 is stirred frequently inside the vessel, before being supplied to the squeegee 37.

In cases such as the present invention where the viscous material 31 is inside a chamber 11a, the viscous material 31 is unable to be stirred prior to supplying, but considering that the viscous material 31 inside the chamber 11a flows during the printing operation, it is clear that the viscous material 31 is stirred prior to the commencement of printing by moving the application unit 11 back and forth across the top of the screen 34 with a discharge pressure applied, and performing this type of operation prior to printing is a suitable technique for stabilizing the printing.

In addition, in those cases where there is a need to stir the viscous material 31, then as shown in FIG. 24A and FIG. 24B, a shaft 42 is provided inside the chamber 11a so that the viscous material 31 is stirred by rotating this shaft. The shaft 42 sits inside the chamber 11a and is supported at both ends, and O-rings 43 prevent the viscous material 31 from leaking out. A pulley 44 is fixed to at least one end of the shaft 42, and the pulley 44 is connected to a motor 46 via a belt 45. In other words, by rotating the motor 46, the shaft 42 rotates and the viscous material 31 is forcibly stirred.

Figure 25:
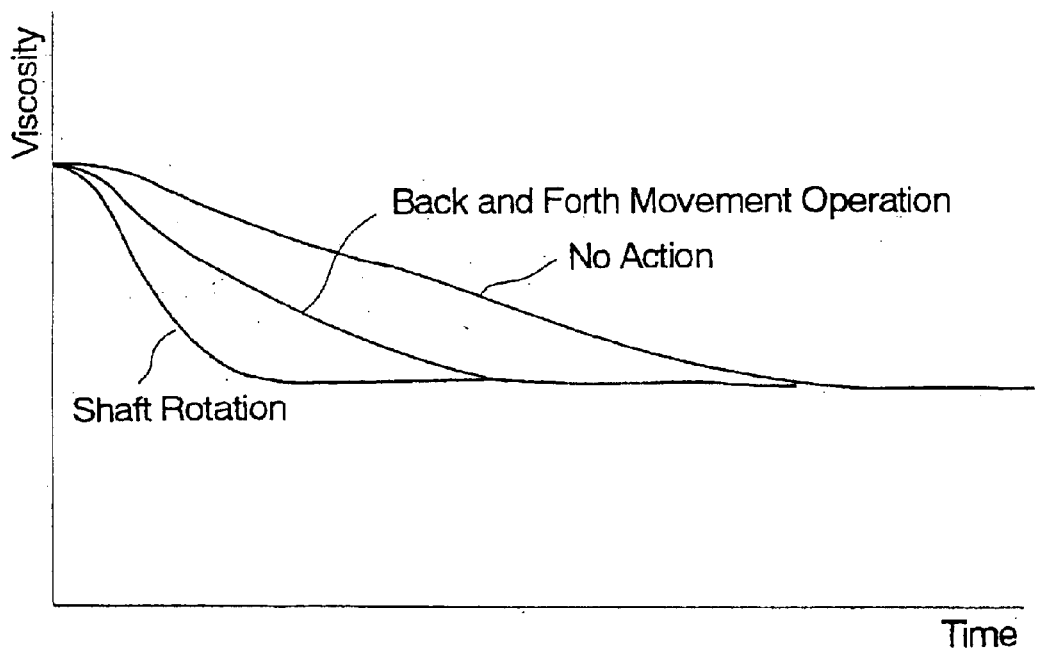
FIG. 25 is a graph showing viscosity variation of a viscous material.

As shown in FIG. 25, if the viscous material 31 is viewed in terms of viscosity, then during each printing operation the viscous material 31 is flowing and so the viscosity decreases, albeit gradually. By moving the application unit (print head) 11 back and forth, the viscosity of the viscous material 31 is lowered by a certain amount in advance, although by using the shaft 42, the viscosity is lowered even further and the degree of viscosity variation in the viscous material 31 during subsequent printing is reduced. Needless to say, rotating the shaft 42 while moving the print head 11 back and forth is even more effective.

Figure 26A:
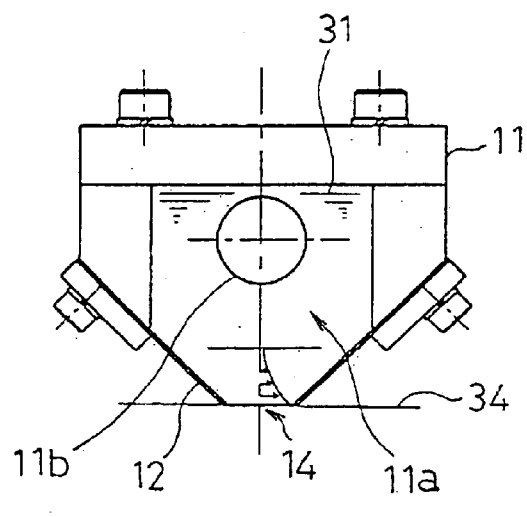
FIG. 26A and FIG. 26B are diagrams showing flow velocity distributions for a viscous material.

As follows is a description of the flow velocity of the viscous material 31 inside the chamber 11a, based on FIG. 26A and FIG. 26B. The flow velocity of the viscous material 31 during printing, as shown by the arrows of FIG. 26A, is largest at the location of the discharge port 14 and decreases with movement up and away from the discharge port. In cases where the viscosity of the viscous material 31 is high, because the material is less inclined to flow, the flow velocity is smaller, and accordingly the flow velocity at the location of the discharge port 14 falls and no longer matches the velocity of the print head 11, which causes slipping between the screen 34 and the viscous material 31, making printing difficult. Furthermore, in cases where the printing speed is high, the flow velocity at the location of the discharge port 14 attempts to speed up, but the viscosity of the viscous material 31 inside the chamber 11a acts as resistance and prevents the flow velocity at the discharge port 14 from increasing, and accordingly slipping develops between the screen 34 and the viscous material 31, and printing becomes difficult.

Figure 26B:
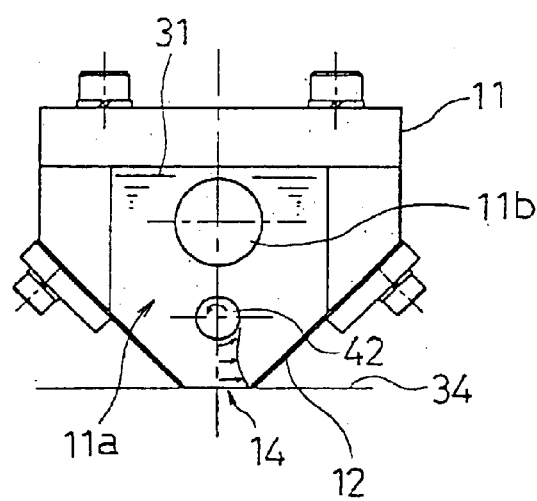
Figure 29A:
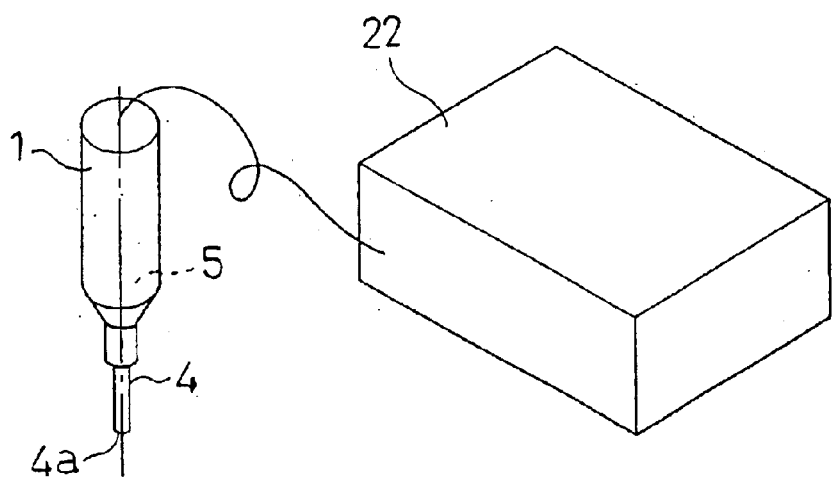
FIG. 29A and FIG. 29B are schematic perspective views showing two types of conventional viscous material application apparatus.
Figure 29B:
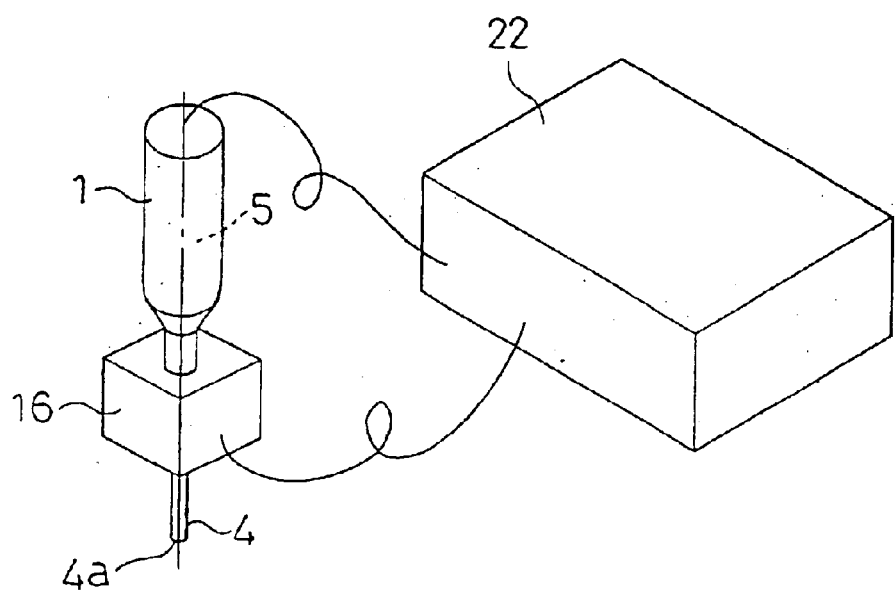
Figure 30:
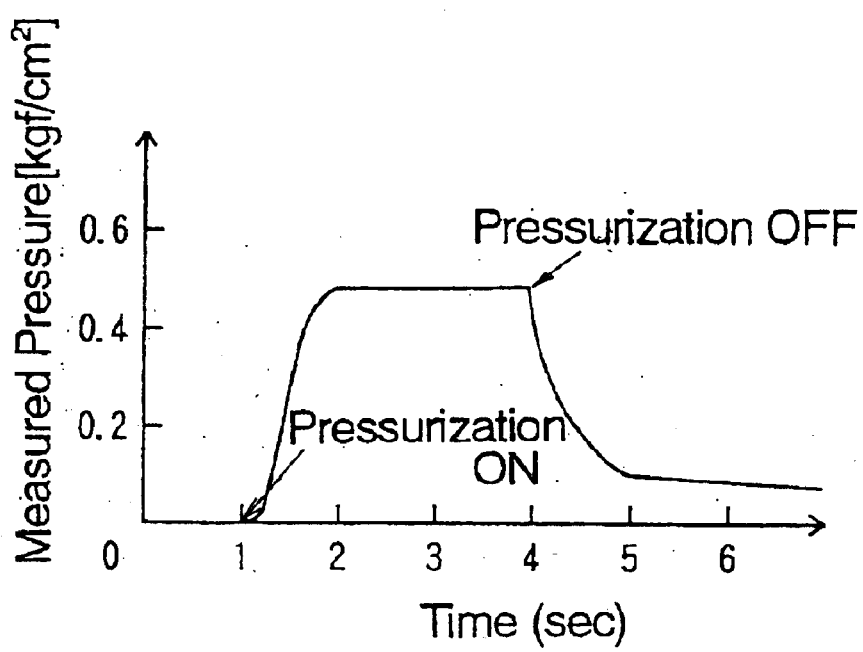
FIG. 30 is a graph showing data for the responsiveness of the discharge pressure for the same conventional example.
Figure 31A:
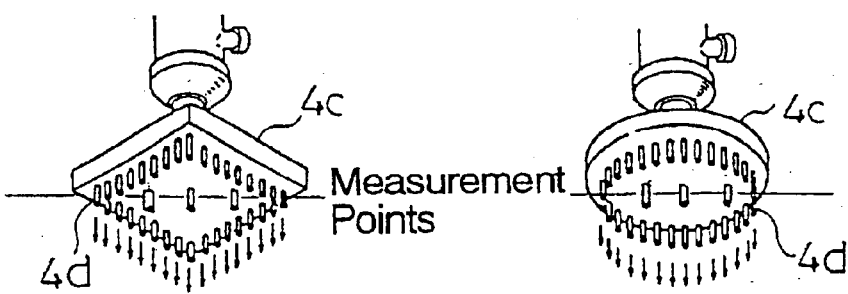
FIG. 31A and FIG. 31B are schematic perspective views showing two types of multiple nozzles of other conventional examples.
Figure 31B:
Figure 32A:
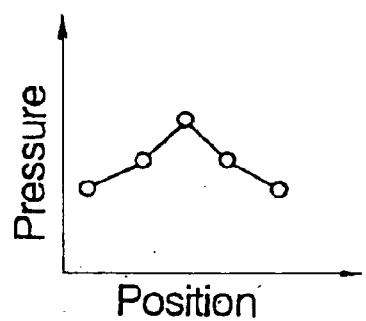
FIG. 32A and FIG. 32B are graphs showing data for the discharge pressure from the multiple nozzles of the same conventional examples, corresponding with the measurement points of FIG. 31A and FIG. 31B respectively.
Figure 32B:
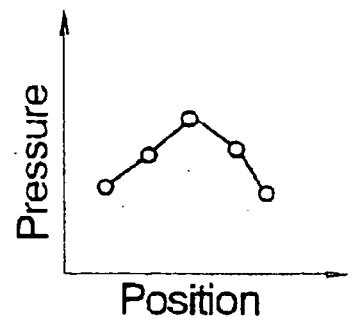

As shown in FIG. 26B, by also rotating the shaft 42 provided inside the chamber 11a during printing, the flow of the viscous material 31 inside the chamber 11a is promoted, and so in those cases where the viscosity of the viscous material 31 is high or in cases where the printing speed is high, the flow velocity at the location of the discharge port 14 is increased, and accordingly printing is carried out without slipping occurring between the screen 34 and the viscous material 31.

Of course the shaft 42 may also be freed and allowed to rotate in accordance with the flow of the viscous material 31, and furthermore a strain gauge or the like could also be attached to the end axis of the shaft 42 to enable the viscosity to be measured, but forcibly rotating the shaft 42 is more effective.

Next is a description of a method of retracting the print head (application unit) 11 from a screen 34 without leaving any viscous material 31 on the surface of the screen, with reference to FIG. 27A–FIG. 27E. As shown in FIG. 27A, there is the viscous material 31 inside a chamber 11a of the print head 11, and the viscous material 31 contacts the screen 34 at the discharge port 14. As shown in FIG. 27B, if the print head 11 is simply lifted in this state, then a large amount of the viscous material 31 is left on the screen 34. Furthermore, as shown in FIG. 27C, even if the print head 11 is lifted after deflating the air pouch 11b, using the same technique used to prevent the viscous material 31 hanging down from the discharge port 14, then some viscous material 31 is still left on the screen 34. Reusing this remaining viscous material 31 requires considerable effort, and so all of the viscous material 31 on the screen 34 must be recovered by the print head 11.

According to the present invention, by deflating the air pouch 11b inside the chamber 11a the capacity of the space available for storing the viscous material is increased, and by moving the viscous material 31 inside the chamber 11a away from the screen 34, recovery of the viscous material 31 is carried out with ease. By moving the viscous material 31 inside the chamber 11a in this manner (moving the viscous material away from the screen 34), the present invention enables the recovery of the viscous material 31 to be carried out with ease. In this embodiment, the viscous material 31 was moved by deflating the air pouch 11b, as described below, but the method for increasing the capacity of the space available for storing the viscous material inside the chamber 11a is not restricted to this method.

In this embodiment, as shown in FIG. 27C, the air pouch 11b is deflated to increase the capacity of the space available for storing the viscous material inside the chamber 11a, and so as shown in FIG. 27D, by moving the print head 11 horizontally and scraping up the viscous material 31 on the screen 34 with the thin blades 12, and then lifting the print head 11 up while the horizontal movement is continued as shown in FIG. 27E, the print head 11 is separated from the screen 34 without leaving any viscous material 31 on the surface of the screen 34.

As follows is a description of a method of rapidly returning the application unit 11 to room temperature, based on FIG. 28A to FIG. 28C. When production is halted during use, a lid or the like is usually placed on the application unit 11 and the viscous material 31 is stored in a refrigerator or the like. When production is restarted, the temperature of the viscous material 31 needs to be returned to room temperature, and as shown in FIG. 28B, this normally requires the viscous material 31 to be removed from the refrigerator at least 30 minutes prior to the start of production. If exchange of the viscous material 31 occurs frequently, then considerable time and effort is expended on returning the viscous material 31 to room temperature.

In the present invention, by replacing the air inside the air pouch 11b as shown in FIG. 28A, the temperature of the viscous material 31 is rapidly returned to room temperature as shown in FIG. 28C, and so production is started earlier and excessive amounts of time and effort are eliminated.

INDUSTRIAL APPLICABILITY

As described above, according to the present invention, discharge pressure regulating device positioned near the discharge port enables efficient pressure transmission to occur when a viscous material stored inside a pressurized chamber is discharged, and enables an instantaneous discharge to be carried out at an appropriate and uniform discharge pressure with good efficiency and a high degree of accuracy, and moreover by utilizing the invention in screen printing, the increase in precision of the filling pressure at an opening of the screen enables leakage or bridge generation by the viscous material to be prevented, and so the invention is useful in improving the printing quality.

What is claimed is:

1. A viscous material application apparatus comprising:
   a main body having a single pressurized chamber for storing a viscous material, the pressurized chamber connecting through to a single discharge port;
   a plurality of viscous material supply devices for transferring said viscous material under pressure to said pressurized chamber, all of said plurality of viscous material supply devices containing the same type of viscous material; and
   a single discharge pressure regulating device for regulating a discharge pressure of said viscous material by increasing and decreasing a capacity of said pressurized chamber when said viscous material inside said pressurized chamber is pressurized and discharged, the discharge pressure regulating device being provided either inside said pressurized chamber or facing said pressurized chamber,
   wherein the pressurized chamber, the discharge pressure regulating device and the discharge port are shared across the plurality of linearly aligned viscous material supply devices, and a discharge pressure of said viscous material at discharge positions along an alignment direction of said viscous material supply devices is regulated in a single batch,
   wherein a pair of inclined plates are attached to both sides of a lower section of said pressurized chamber so as to approach one another in a downward direction, and an opening between bottom edges of said plates is used as a discharge port.

2. The viscous material application apparatus according to claim 1, wherein a soft elastic material is inserted between each of said inclined plates and a lower side surface of said pressurized chamber.

3. A screen printing machine comprising the viscous material application apparatus according to claim 1 as a print head.

4. A viscous material application apparatus comprising:
   a main body having a single pressurized chamber for storing a viscous material, the pressurized chamber connecting through to a single discharge port;
   a plurality of viscous material supply devices for transferring said viscous material under pressure to said pressurized chamber, all of said plurality of viscous material supply devices containing the same type of viscous material; and
   a single discharge pressure regulating device for regulating a discharge pressure of said viscous material by increasing and decreasing a capacity of said pressurized chamber when said viscous material inside said pressurized chamber is pressurized and discharged, the discharge pressure regulating device being provided either inside said pressurized chamber or facing said pressurized chamber,
   wherein the pressurized chamber, the discharge pressure regulating device and the discharge port are shared across the plurality of linearly aligned viscous material supply devices, and a discharge pressure of said viscous material at discharge positions along an alignment direction of said viscous material supply devices is regulated in a single batch,
   wherein a pressure detecting member is provided at either one of an inside edge of said pressurized chamber and a position between the pressurized chamber and said viscous material supply device, and said pressure detecting member detects when said pressurized chamber is filled with said viscous material.

5. The viscous material application apparatus according to claim 4, wherein when said pressurized chamber is pressurized by said discharge pressure regulating device, in cases where a detected pressure at said pressure detecting member does not reach a predetermined pressure, an amount of viscous material is judged to be insufficient, and said viscous material is supplied by said viscous material supply device.

6. The viscous material application apparatus according to claim 4, wherein said pressurized chamber is moved while pressurized by said discharge pressure regulating device, and a pressure of said discharge pressure regulating device is regulated based on a pressure of said pressurized chamber detected with said pressure detecting member.

7. A viscous material application apparatus comprising:
   a main body having a single pressurized chamber for storing a viscous material, the pressurized chamber connecting through to a single discharge port;
   a plurality of viscous material supply devices for transferring said viscous material under pressure to said pressurized chamber, all of said plurality of viscous material supply devices containing the same type of viscous material; and
   a single discharge pressure regulating device for regulating a discharge pressure of said viscous material by increasing and decreasing a capacity of said pressurized chamber when said viscous material inside said pressurized chamber is pressurized and discharged, the discharge pressure regulating device being provided either inside said pressurized chamber or facing said pressurized chamber,
   wherein the pressurized chamber, the discharge pressure regulating device and the discharge port are shared across the plurality of linearly aligned viscous material supply devices, and a discharge pressure of said viscous material at discharge positions along an alignment direction of said viscous material supply devices is regulated in a single batch,
   wherein a rotatable shaft is provided in said pressurized chamber, and said viscous material is mobilized by rotating said shaft.

8. A viscous material application apparatus comprising:
- a main body having a single pressurized chamber for storing a viscous material, the pressurized chamber connecting through to a single discharge port;
- a plurality of viscous material supply devices for transferring said viscous material under pressure to said pressurized chamber, all of said plurality of viscous material supply devices containing the same type of viscous material; and
- a single discharge pressure regulating device for regulating a discharge pressure of said viscous material by increasing and decreasing a capacity of said pressurized chamber when said viscous material inside said pressurized chamber is pressurized and discharged, the discharge pressure regulating device being provided either inside said pressurized chamber or facing said pressurized chamber,
- wherein the pressurized chamber, the discharge pressure regulating device and the discharge port are shared across the plurality of linearly aligned viscous material supply devices, and a discharge pressure of said viscous material at discharge positions along an alignment direction of said viscous material supply devices is regulated in a single batch,
- wherein said viscous material is recovered into said pressurized chamber by setting a pressure of said pressurized chamber to a negative pressure by said discharge pressure regulating device, and lifting said pressurized chamber while moving said chamber horizontally.

9. A viscous material application method wherein a single pressurized chamber, discharge pressure regulating device and discharge port are shared across a plurality of linearly aligned viscous material supply devices, a discharge pressure of a viscous material is regulated in a single batch by increasing and decreasing a capacity of said pressurized chamber when said viscous material inside said pressurized chamber is pressurized and discharged, and said viscous material is recovered into said pressurized chamber by setting a pressure of said pressurized chamber to a negative pressure by said discharge pressure regulating device, and lifting said pressurized chamber.

10. A viscous material application method wherein a single pressurized chamber, discharge pressure regulating device and discharge port are shared across a plurality of linearly aligned viscous material supply devices, a discharge pressure of a viscous material is regulated in a single batch by increasing and decreasing a capacity of said pressurized chamber when said viscous material inside said pressurized chamber is pressurized and discharged, and said viscous material is recovered into said pressurized chamber by setting a pressure of said pressurized chamber to a negative pressure by said discharge pressure regulating device, and lifting said pressurized chamber while moving said chamber horizontally.

* * * * *